United States Patent
Lee et al.

(10) Patent No.: US 12,166,095 B2
(45) Date of Patent: Dec. 10, 2024

(54) SEMICONDUCTOR DEVICE AND METHOD

(71) Applicant: Taiwan Semiconductor Manufacturing Co., Ltd., Hsinchu (TW)

(72) Inventors: Hsin-Yi Lee, Hsinchu (TW); Cheng-Lung Hung, Hsinchu (TW); Weng Chang, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/525,521

(22) Filed: Nov. 30, 2023

(65) Prior Publication Data
US 2024/0113183 A1  Apr. 4, 2024

Related U.S. Application Data

(62) Division of application No. 16/909,260, filed on Jun. 23, 2020, now Pat. No. 11,855,163.

(51) Int. Cl.
*H01L 29/417* (2006.01)
*H01L 21/8234* (2006.01)
*H01L 29/66* (2006.01)
*H01L 29/78* (2006.01)

(52) U.S. Cl.
CPC ........... *H01L 29/41791* (2013.01); *H01L 21/823431* (2013.01); *H01L 29/66795* (2013.01); *H01L 29/785* (2013.01); *H01L 2029/7857* (2013.01)

(58) Field of Classification Search
None
See application file for complete search history.

(56) References Cited

U.S. PATENT DOCUMENTS

| | | | |
|---|---|---|---|
| 8,487,378 | B2 | 7/2013 | Goto et al. |
| 8,729,634 | B2 | 5/2014 | Shen et al. |
| 8,826,213 | B1 | 9/2014 | Ho et al. |
| 8,887,106 | B2 | 11/2014 | Ho et al. |
| 9,177,865 | B2 | 11/2015 | Kim et al. |
| 9,972,694 | B2 | 5/2018 | Lee et al. |
| 10,297,453 | B2 | 5/2019 | Tsai et al. |

(Continued)

FOREIGN PATENT DOCUMENTS

| | | |
|---|---|---|
| KR | 20140142957 A | 12/2014 |
| KR | 20190063353 A | 6/2019 |

(Continued)

*Primary Examiner* — Michelle Mandala
*Assistant Examiner* — Jordan M Klein
(74) *Attorney, Agent, or Firm* — Slater Matsil, LLP

(57) ABSTRACT

Methods for tuning effective work functions of gate electrodes in semiconductor devices and semiconductor devices formed by the same are disclosed. In an embodiment, a semiconductor device includes a channel region over a semiconductor substrate; a gate dielectric layer over the channel region; and a gate electrode over the gate dielectric layer, the gate electrode including a first work function metal layer over the gate dielectric layer, the first work function metal layer including aluminum (Al); a first work function tuning layer over the first work function metal layer, the first work function tuning layer including aluminum tungsten (AlW); and a fill material over the first work function tuning layer.

20 Claims, 26 Drawing Sheets

(56) References Cited

U.S. PATENT DOCUMENTS

| | | |
|---|---|---|
| 10,867,998 B1 | 12/2020 | Hung et al. |
| 10,923,576 B2 | 2/2021 | Lee et al. |
| 2014/0282326 A1 | 9/2014 | Chen et al. |
| 2014/0363960 A1 | 12/2014 | Kim et al. |
| 2015/0325447 A1* | 11/2015 | Ogawa ................ C23C 16/4412 118/704 |
| 2016/0211251 A1 | 7/2016 | Liaw |
| 2017/0062282 A1 | 3/2017 | Lin et al. |
| 2017/0110324 A1* | 4/2017 | Tsai .................. H01L 21/76886 |
| 2017/0110552 A1 | 4/2017 | Lee et al. |
| 2018/0323303 A1* | 11/2018 | Liu ..................... H01L 29/4966 |
| 2018/0358448 A1 | 12/2018 | Chiang et al. |
| 2019/0109202 A1 | 4/2019 | Chiang et al. |
| 2019/0267374 A1 | 8/2019 | Hung et al. |
| 2019/0333769 A1 | 10/2019 | Chen et al. |

FOREIGN PATENT DOCUMENTS

| | | |
|---|---|---|
| KR | 20190132615 A | 11/2019 |
| TW | 201603269 A | 1/2016 |

\* cited by examiner

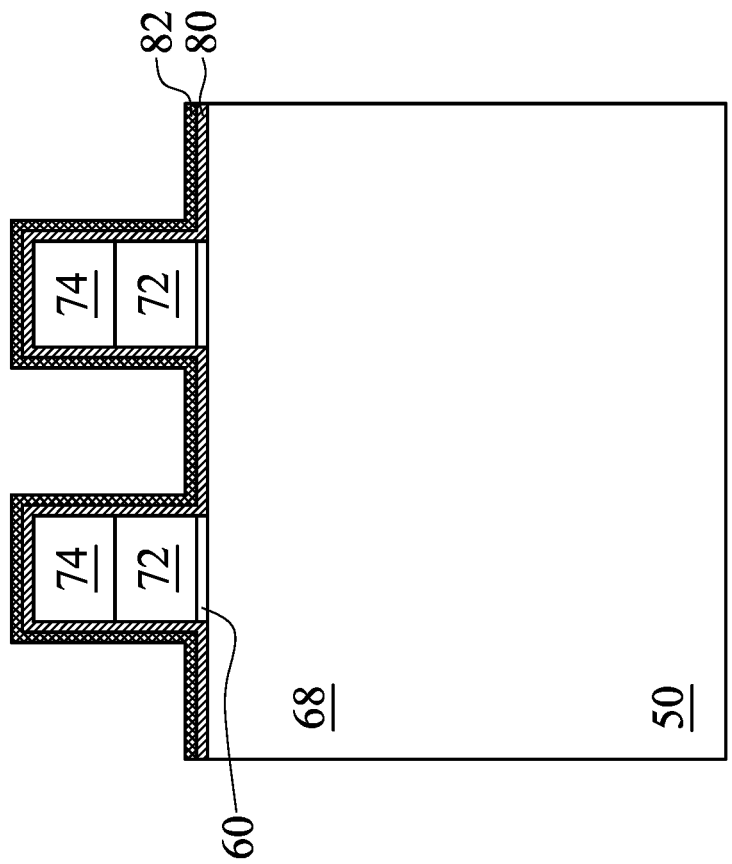
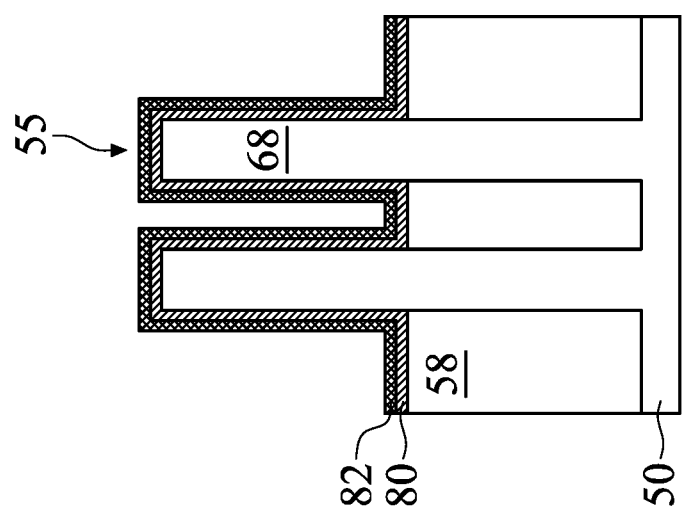

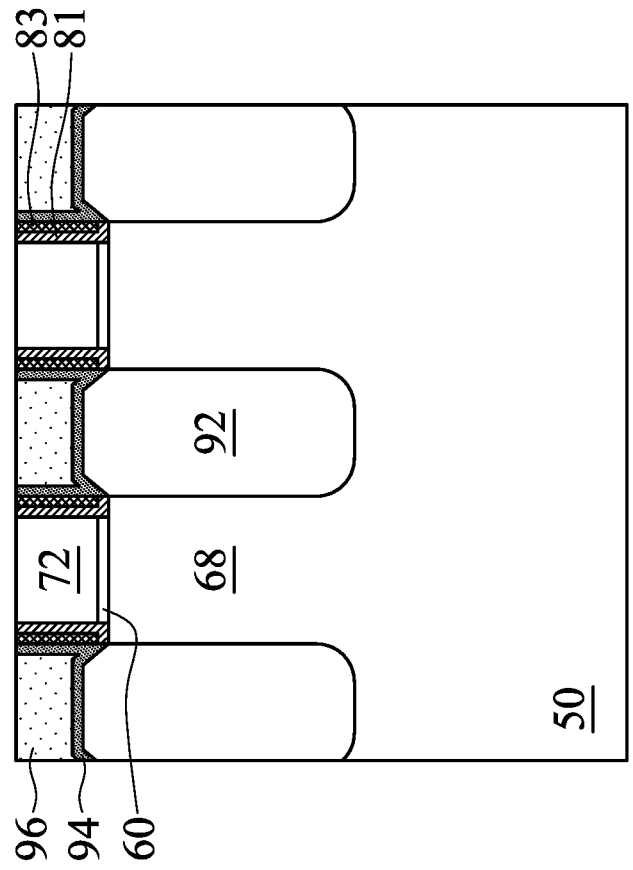
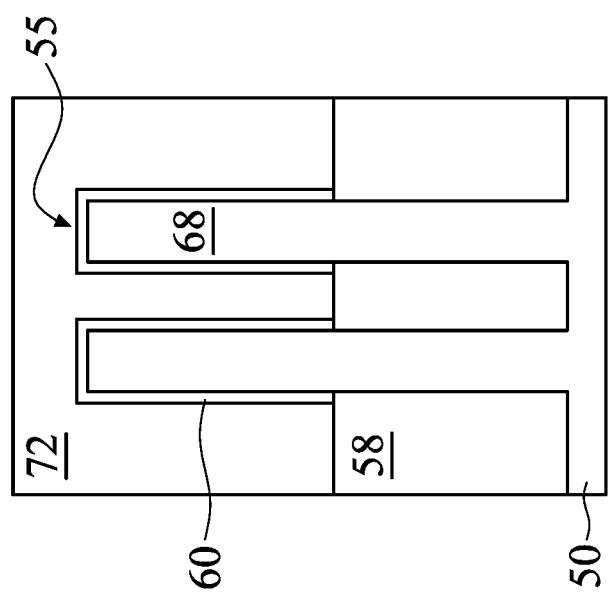
Figure 12B
Figure 12A

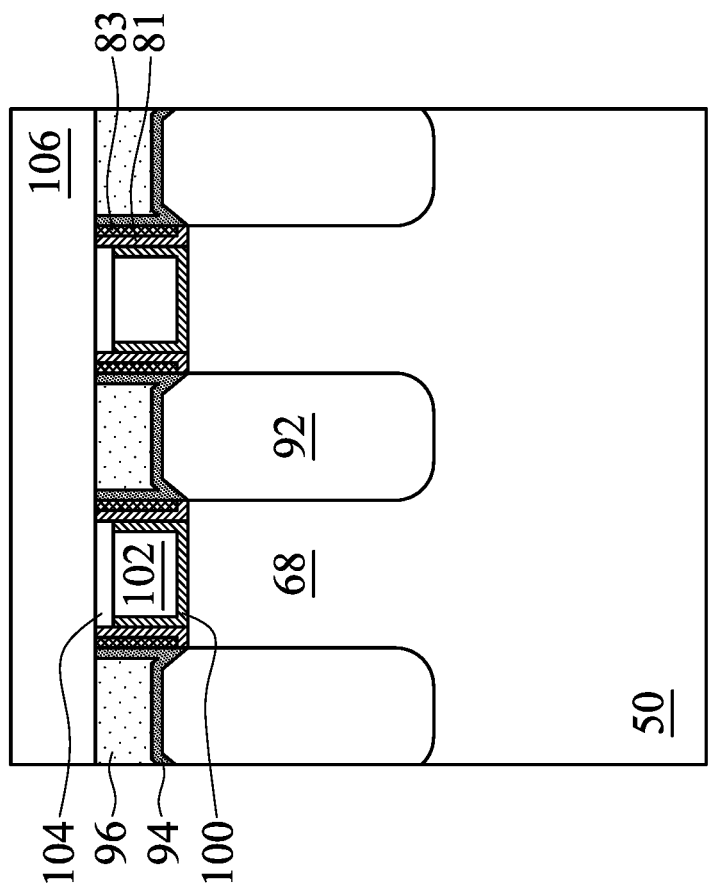
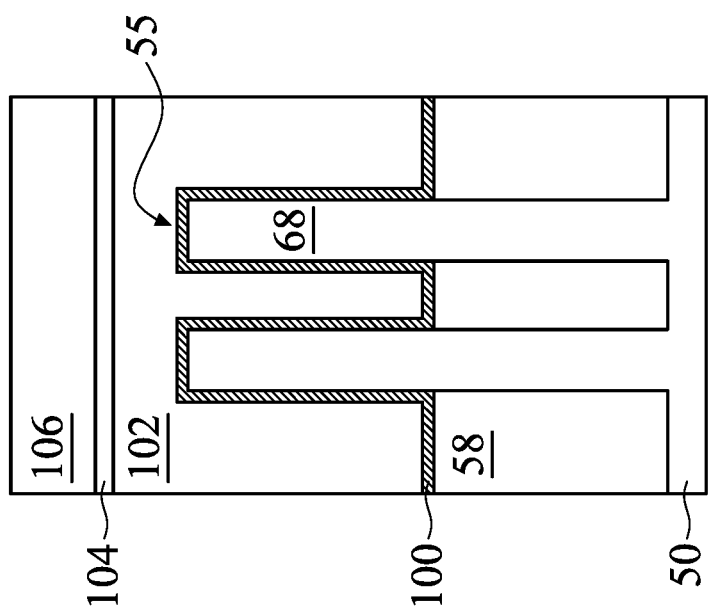
Figure 20B
Figure 20A

SEMICONDUCTOR DEVICE AND METHOD

CROSS-REFERENCE TO RELATED APPLICATIONS

This application is a divisional of U.S. patent application Ser. No. 16/909,260, filed on Jun. 23, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 10C, 11A, 11B, 12A, 12B, 13A, 13B, 14A, 14B, 15A, 15B, 16A, 16B, 17A, 17B, 18A, 18B, 19A, 19B, 20A, 20B, 21A, and 21B are cross-sectional views of intermediate stages in the manufacturing of semiconductor devices, in accordance with some embodiments.

DETAILED DESCRIPTION OF ILLUSTRATIVE EMBODIMENTS

Figure 1:
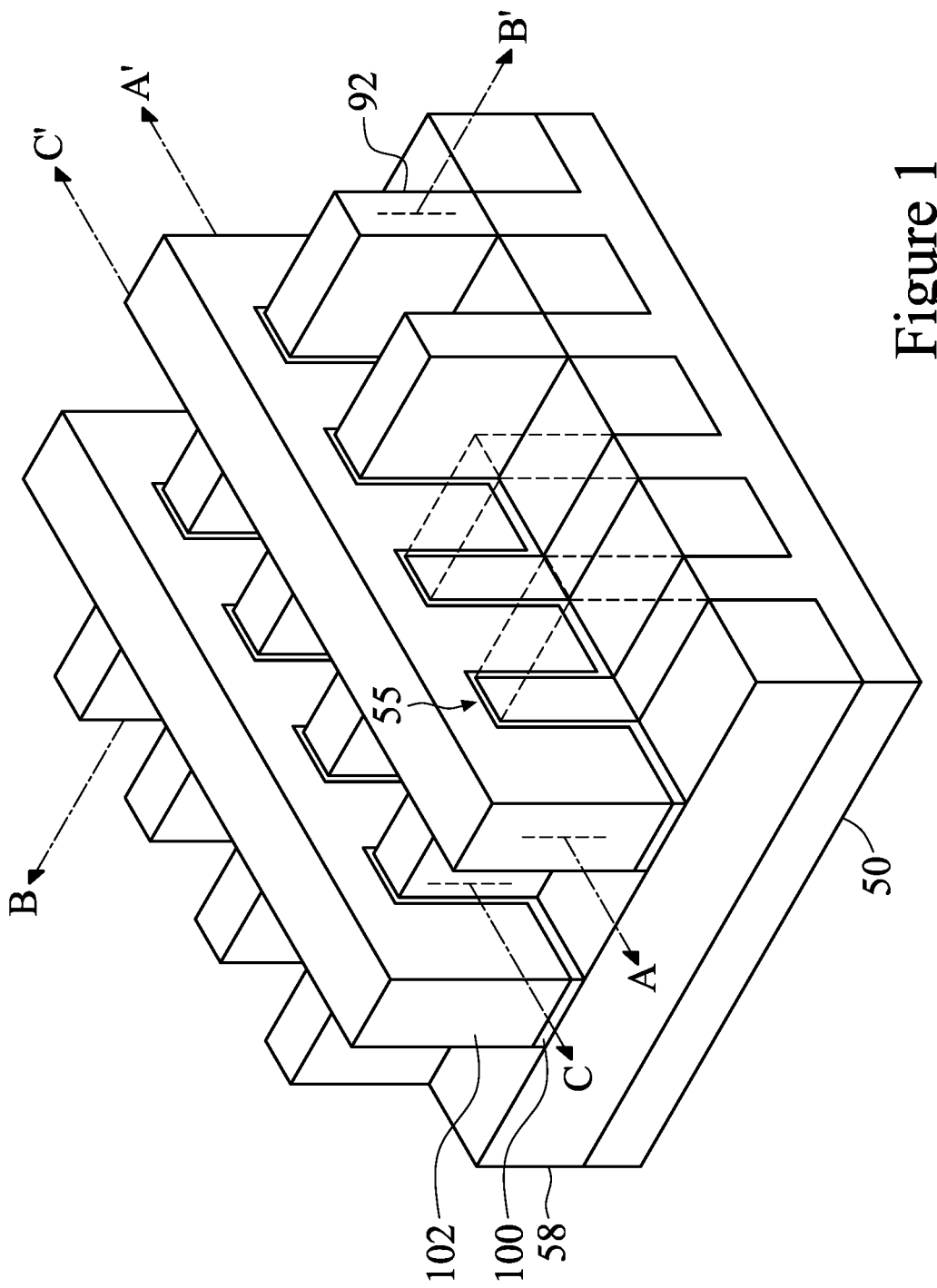
FIG. 1 illustrates an example of a semiconductor device including fin field-effect transistors (FinFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods of tuning work function values of gate electrodes in semiconductor devices and semiconductor devices formed by said methods. The work function values may be tuned by performing various processes on work function metal layers included in the gate electrodes of the semiconductor devices. For example, in some embodiments, the work function values may be tuned by implanting a dopant in a p-type work function metal layer. The dopant may include lanthanum, aluminum, magnesium or the like. In some embodiments, the work function values may be tuned by exposing an n-type work function metal layer to a tuning gas. The tuning gas may be a transition metal chloride, such as tungsten chloride, tantalum chloride, hafnium chloride, titanium chloride or the like. Exposing the n-type work function metal layer to the tuning gas may deposit a tuning layer over the n-type work function metal layer, may alter the composition of the n-type work function metal layer, and may deposit a thin layer over the n-type work function metal layer, thereby forming a work function layer that may be more suitable to p-type transistors. Thinning the n-type work function metal layer may increase the process window for filling the gate electrodes, which provides greater flexibility for subsequently deposited layers. By tuning the work function values of semiconductor devices, semiconductor devices having lower threshold voltages ($V_t$), higher speed, and better performance may be manufactured.

FIG. 1 illustrates an example of FinFETs, in accordance with some embodiments. The FinFETs comprises fins 55 on a substrate 50 (e.g., a semiconductor substrate). Shallow trench isolation (STI) regions 58 are disposed in the substrate 50, and the fins 55 protrude above and from between neighboring STI regions 58. Although the STI regions 58 are described/illustrated as being separate from the substrate 50, as used herein the term "substrate" may be used to refer to just the semiconductor substrate or a semiconductor substrate inclusive of STI regions. Additionally, although the fins 55 are illustrated as single, continuous materials with the substrate 50, the fins 55 and/or the substrate 50 may comprise a single material or a plurality of materials. In this context, the fins 55 refer to the portions extending between the neighboring STI regions 58.

Gate dielectric layers 100 are along sidewalls and over a top surface of the fins 55, and gate electrodes 102 are over the gate dielectric layers 100. Epitaxial source/drain regions 92 are disposed on opposite sides of the fins 55, the gate dielectric layers 100, and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of the FinFETs. Cross-section B-B' is perpendicular to cross-section A-A' and is along a longitudinal axis of a fin 55 and in a direction of, for example, the current flow between the epitaxial source/drain regions 92 of the FinFETs. Cross-section C-C' is parallel to cross-section A-A' and extends through the epitaxial source/drain regions 92 of the FinFETs. Subsequent figures refer to these reference cross-sections for clarity.

Some embodiments discussed herein are discussed in the context of fin field effect transistors (FinFETs) formed using gate-last processes. In some embodiments, a gate-first process may be used. Also, some embodiments contemplate aspects used in planar devices (e.g., planar field effect transistors), nanostructure (e.g., nanosheet, nanowire, gate-all-around, or the like) field effect transistors (NSFETs), or the like.

FIGS. 2 through 21B are cross-sectional views of intermediate stages in the manufacturing of FinFETs, in accordance with some embodiments. FIGS. 2 through 5 illustrate reference cross-section A-A' illustrated in FIG. 1. FIGS. 6A, 11A, 12A, 13A, 14A, 14B, 15A, 15B, 16A, 16B, 17A, 17B, 18A, 18B, 19A, 20A, and 21A are illustrated along reference cross-section A-A' illustrated in FIG. 1. FIGS. 6B, 7B, 8B, 9B, 10B, 11B, 12B, 13B, 19B, 20B, and 21B are illustrated along a similar cross-section B-B' illustrated in FIG. 1. FIGS. 7A, 8A, 9A, 10A, and 10C are illustrated along reference cross-section C-C' illustrated in FIG. 1.

Figure 2:
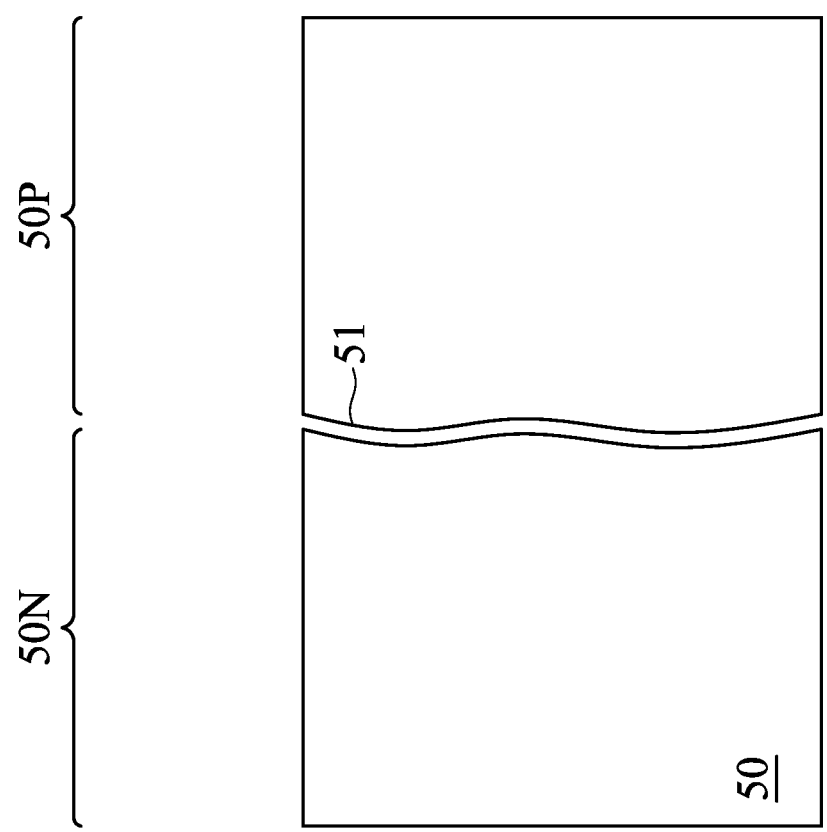

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
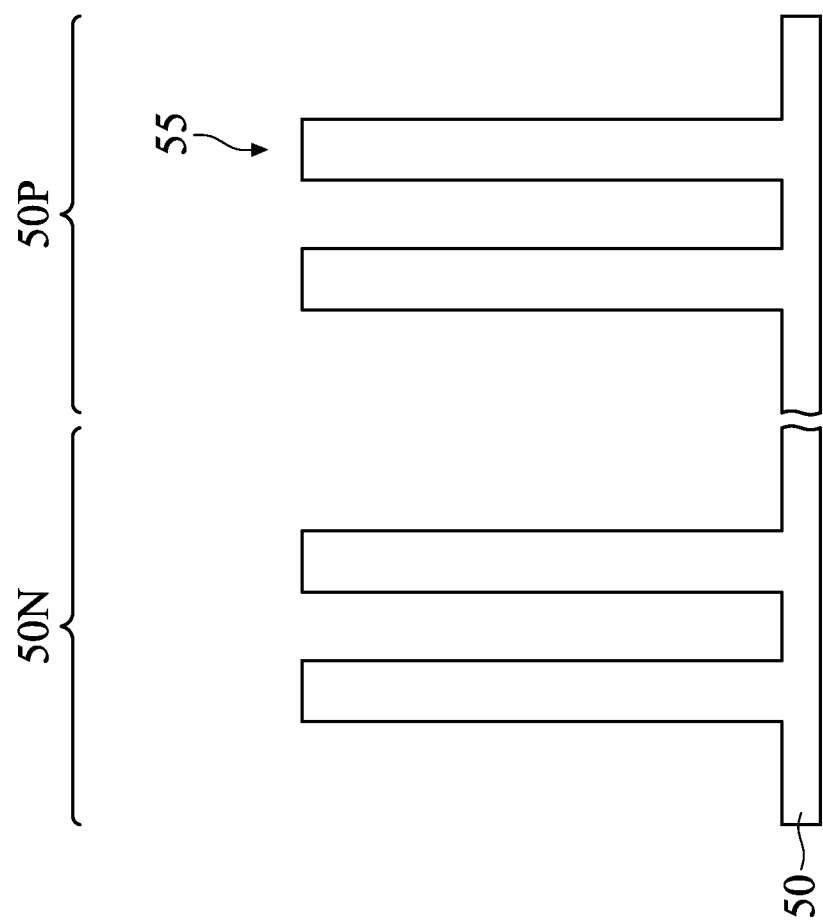

In FIG. 3, fins 55 are formed in the substrate 50. The fins 55 are semiconductor strips. In some embodiments, the fins 55 may be formed in the substrate 50 by etching trenches in the substrate 50. The etching may be any acceptable etch process, such as a reactive ion etch (RIE), a neutral beam etch (NBE), the like, or a combination thereof. The etch may be anisotropic.

The fins 55 may be patterned by any suitable method. For example, the fins 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 55. In some embodiments, the mask (or other layer) may remain on the fins 55.

Figure 4:
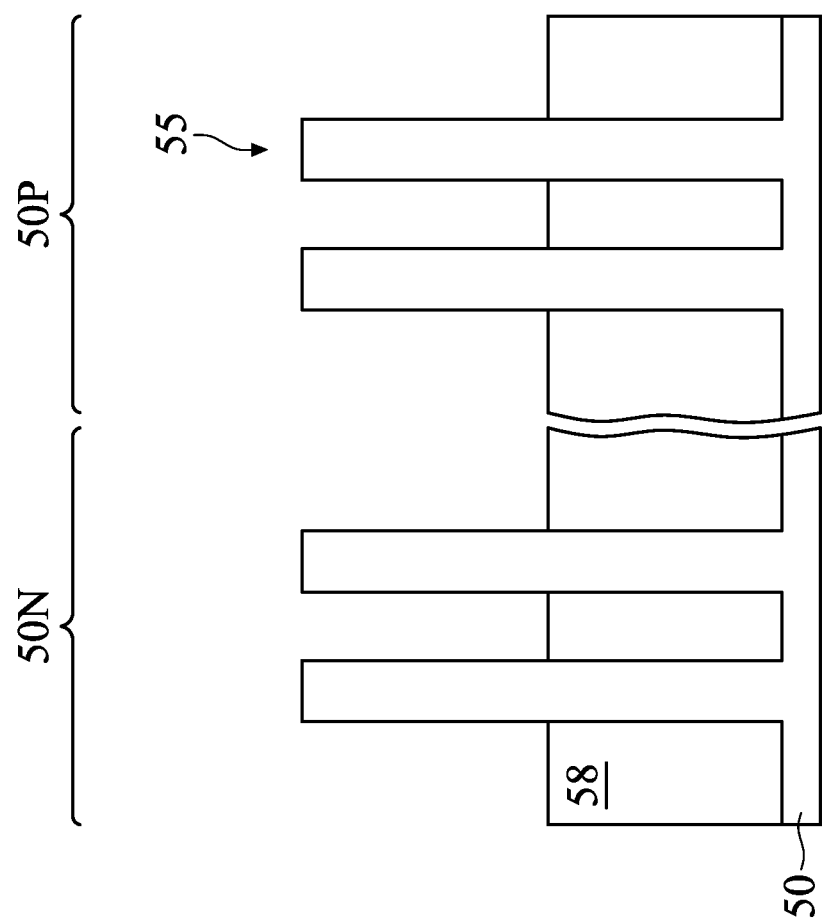

In FIG. 4, shallow trench isolation (STI) regions 58 are formed adjacent the fins 55. The STI regions 58 may be formed by forming an insulation material (not separately illustrated) over the substrate 50 and between neighboring fins 55. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the fins 55. The insulation material may comprise a single layer or may utilize multiple layers. For example, in some embodiments a liner (not separately illustrated) may first be formed along surfaces of the substrate 50 and the fins 55. Thereafter, a fill material, such as those discussed above may be formed over the liner.

A removal process is then applied to the insulation material to remove excess insulation material over the fins 55. In some embodiments, a planarization process such as a chemical mechanical polish (CMP), an etch-back process, combinations thereof, or the like may be utilized. The planarization process may planarize the insulation material and the fins 55. The planarization process exposes the fins 55 such that top surfaces of the fins 55 and the insulation material are level after the planarization process is complete.

The insulation material is then recessed to form the STI regions 58 as illustrated in FIG. 4. The insulation material is recessed such that upper portions of the fins 55 and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the fins 55 and the substrate 50). For example, an oxide removal using, for example, dilute hydrofluoric (dHF) acid may be used.

The process described with respect to FIGS. 2-4 is just one example of how the fins 55 may be formed. In some embodiments, the fins 55 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 55. For example, the fins 55 in FIG. 4 can be recessed, and a material different from the fins 55 may be epitaxially grown over the recessed fins 55. In such embodiments, the fins 55 comprise the recessed material as well as the epitaxially grown material disposed over the recessed material. In some embodiments, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 55. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In some embodiments, upper portions of the fins 55 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 4, appropriate wells (not separately illustrated) may be formed in the fins 55 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not separately illustrated). For example, a photoresist may be formed over the fins 55 and the STI regions 58 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $1\times10^{18}$ atoms/cm³, such as between about $1\times10^{16}$ atoms/cm³ and about $1\times10^{18}$ atoms/cm³. After the implant, the photoresist is removed, such as by an acceptable ashing process.

Following the implanting of the region 50P, a photoresist is formed over the fins 55 and the STI regions 58 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $1\times10^{18}$ atoms/cm³, such as between about $1\times10^{16}$ atoms/cm³ and about $1\times10^{18}$ atoms/cm³. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
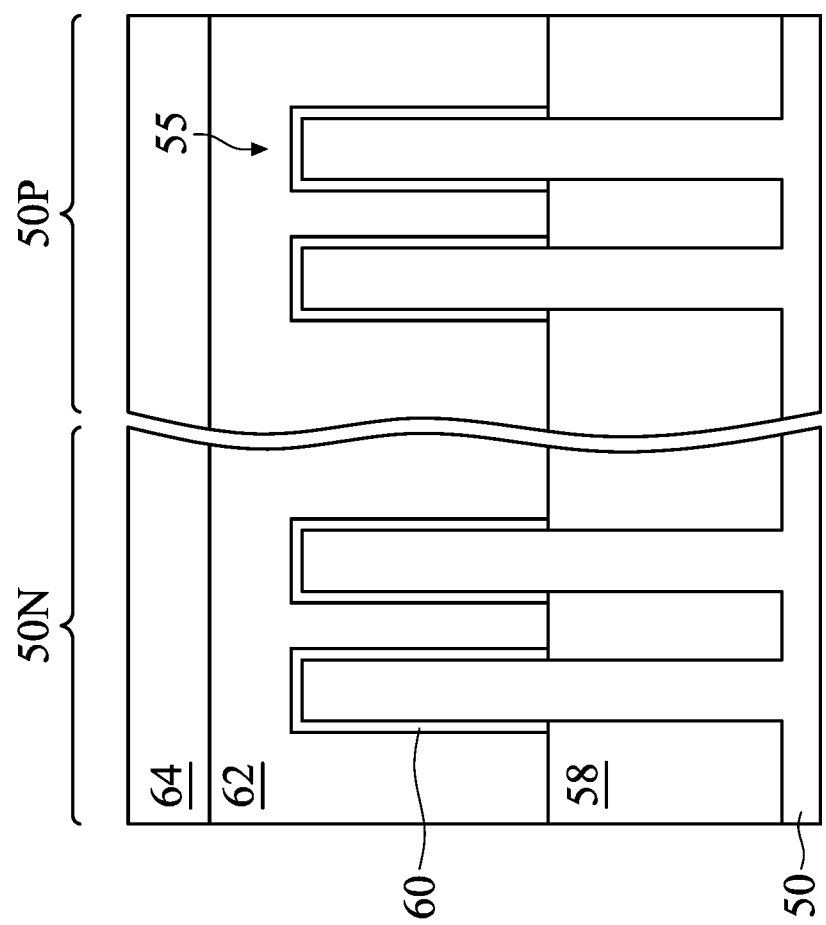

In FIG. 5, dummy dielectric layers 60 are formed on the fins 55 and the substrate 50. The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the material of the STI regions 58. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layers 60 are shown covering only the fins 55 and the substrate 50 for illustrative purposes only. In some embodiments, the dummy dielectric layers 60 may be deposited such that the dummy dielectric layers 60 cover the STI regions 58, extending between the dummy gate layer 62 and the STI regions 58.

FIGS. 6A through 21B illustrate various additional steps in the manufacturing of embodiment devices. FIGS. 6B through 13B and 19A through 21B illustrate features in either of the region 50N or the region 50P. For example, the structures illustrated in FIGS. 6B through 13B and 19A through 21B may be applicable to both the region 50N and the region 50P. Differences (if any) in the structures of the region 50N and the region 50P are described in the text accompanying each figure.

Figure 6A:
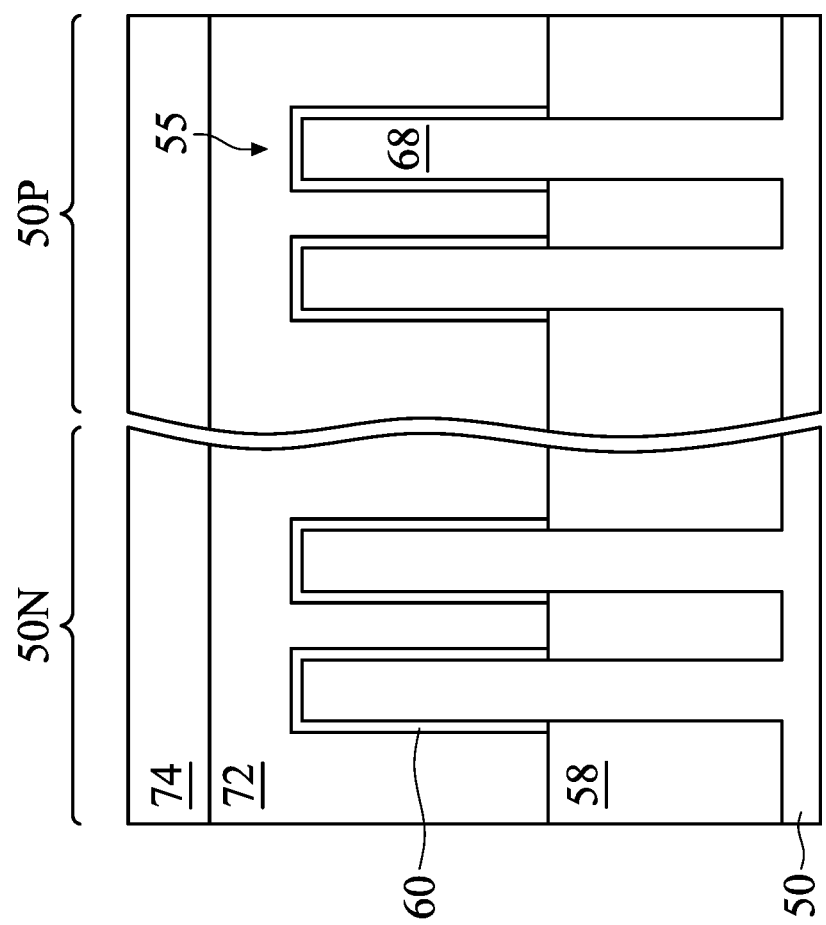
Figure 6B:
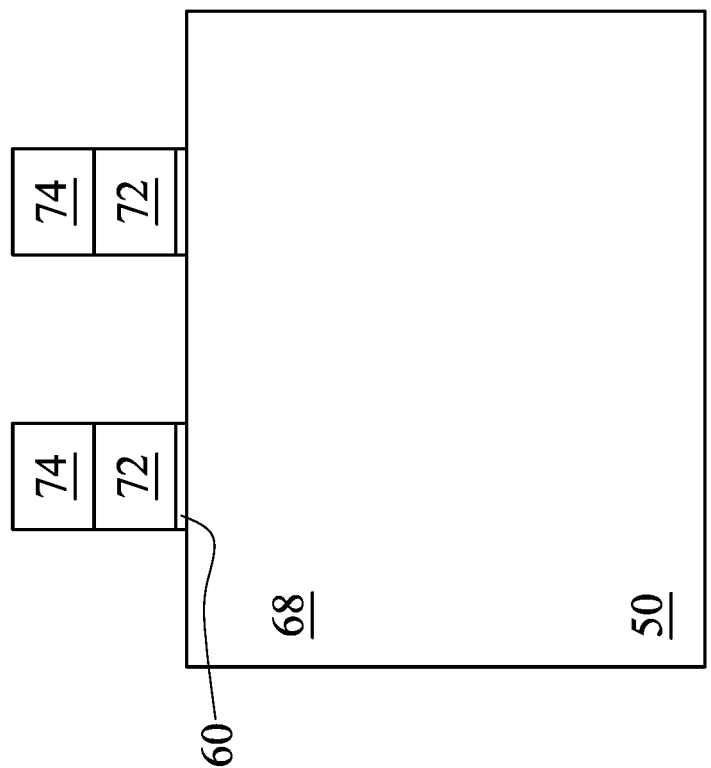

In FIGS. 6A and 6B, the mask layer 64 (see FIG. 5) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions 68 of the fins 55. The pattern of the masks 74 may be used to physically separate each of the dummy gates 72 from adjacent dummy gates. The dummy gates 72 may also have a lengthwise direction substantially perpendicular to the lengthwise direction of respective fins 55. The dummy dielectric layers 60, the dummy gates 72, and the masks 74 may be collectively referred to as "dummy gate stacks."

In FIGS. 7A and 7B, a first spacer layer 80 and a second spacer layer 82 are formed over the structures illustrated in FIGS. 6A and 6B. In FIGS. 7A and 7B, the first spacer layer 80 is formed on top surfaces of the STI regions 58, top surfaces and sidewalls of the fins 55 and the masks 74, and sidewalls of the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figure 8B:
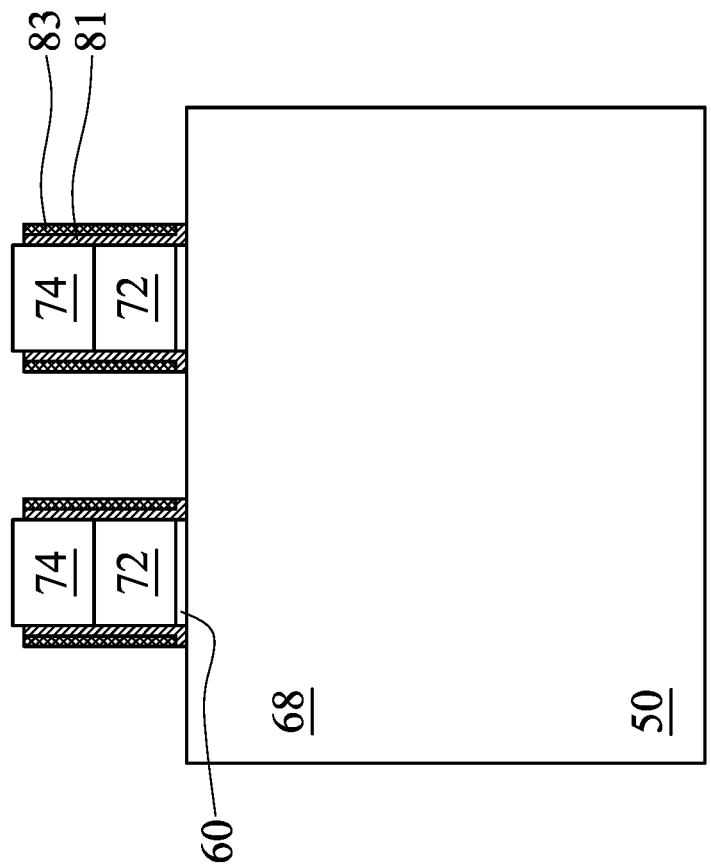
Figure 8A:
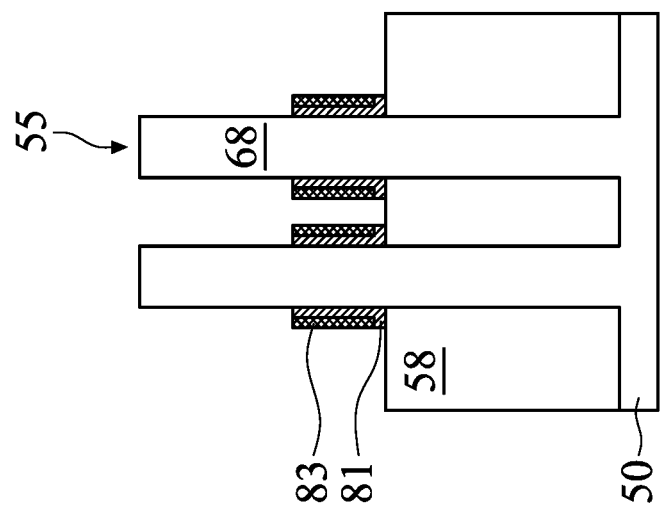

In FIGS. 8A and 8B, the first spacer layer 80 and the second spacer layer 82 are etched to form first spacers 81 and second spacers 83. The first spacer layer 80 and the second spacer layer 82 may be etched using a suitable etching process, such as an anisotropic etching process (e.g., a dry etching process) or the like. The first spacers 81 and second spacers 83 may be disposed on sidewalls of the fins 55, the dummy dielectric layers 60, the dummy gates 72, and the masks 74. The first spacers 81 and the second spacers 83 may have different heights adjacent the fins 55 and the dummy gate stacks due to the etching processes used to etch the first spacer layer 80 and the second spacer layer 82, as well as differing heights between the fins 55 and the dummy gate stacks. Specifically, as illustrated in FIGS. 8A and 8B, in some embodiments, the first spacers 81 and the second spacers 83 may extend partially up sidewalls of the fins 55 and the dummy gate stacks. In some embodiments, the first spacers 81 and the second spacers 83 may extend to top surfaces of the dummy gate stacks.

After the first spacers 81 and the second spacers 83 are formed, implants for lightly doped source/drain (LDD) regions (not separately illustrated) may be performed. In embodiments with different device types, similar to the implants discussed above in FIG. 4, a mask, such as a photoresist, may be formed over the region 50N, while exposing the region 50P, and appropriate type (e.g., p-type) impurities may be implanted into the exposed fins 55 and the substrate 50 in the region 50P. The mask may then be removed. Subsequently, a mask, such as a photoresist, may be formed over the region 50P while exposing the region 50N, and appropriate type impurities (e.g., n-type) may be implanted into the exposed fins 55 and the substrate 50 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $1\times10^{15}$ atoms/cm$^3$ to about $1\times10^{19}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like). Furthermore, the n-type and p-type devices may be formed using a different structures and steps.

Figure 9B:
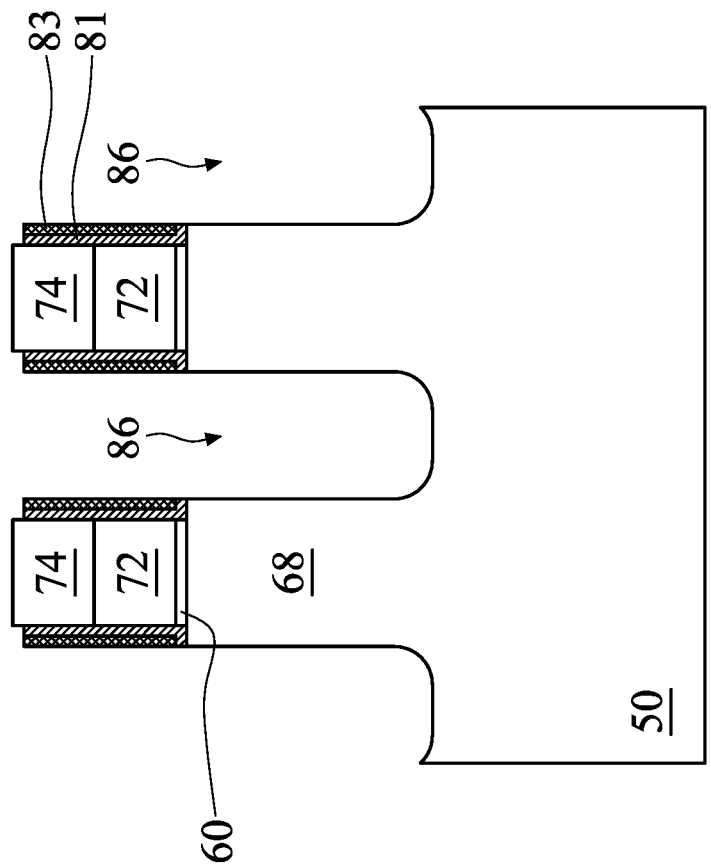
Figure 9A:
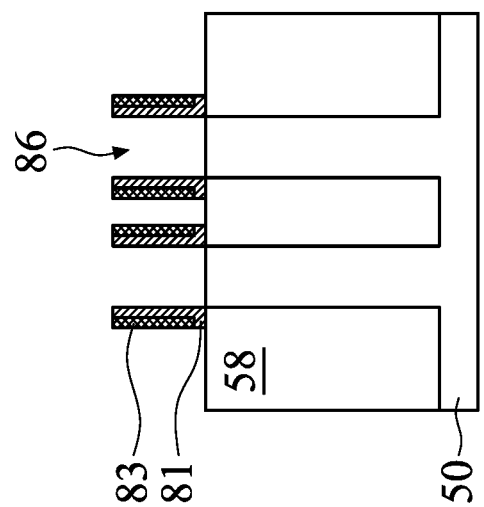

In FIGS. 9A and 9B, first recesses 86 are formed in the fins 55 and the substrate 50. As illustrated in FIG. 9A, top surfaces of the STI regions 58 may be level with top surfaces of the substrate 50. The substrate 50 may be etched such that bottom surfaces of the first recesses 86 are disposed above or below the top surfaces of the STI regions 58. The first recesses 86 may be formed by etching the fins 55 and the substrate 50 using anisotropic etching processes, such as RIE, NBE, or the like. The first spacers 81, the second spacers 83, and the masks 74 mask portions of the fins 55 and the substrate 50 during the etching processes used to form the first recesses 86. A single etch process or multiple etch processes may be used to form the first recesses 86. Timed etch processes may be used to stop the etching of the first recesses 86 after the first recesses 86 reach a desired depth.

Figure 10B:
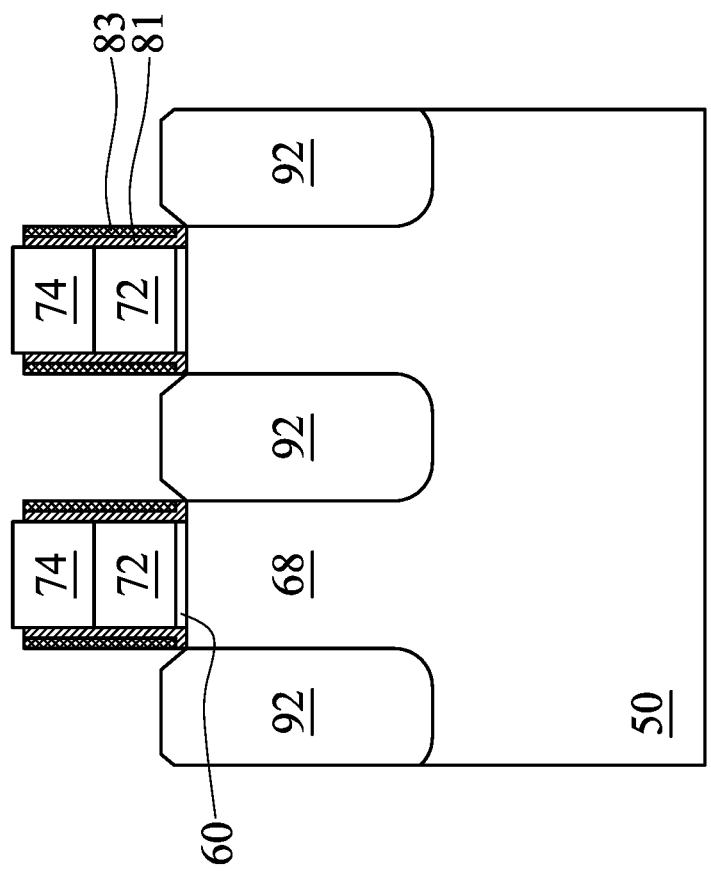
Figure 10A:
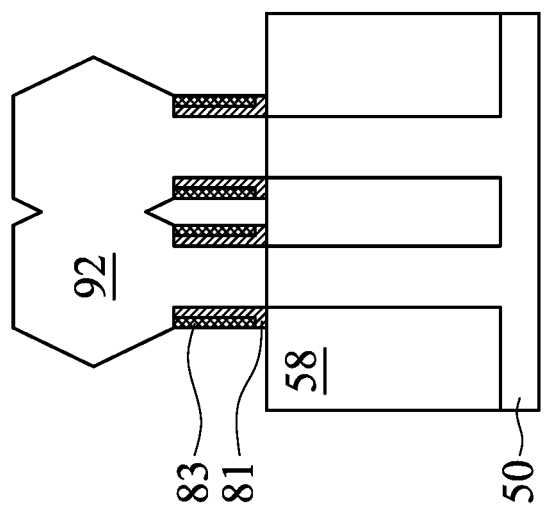
Figure 10C:
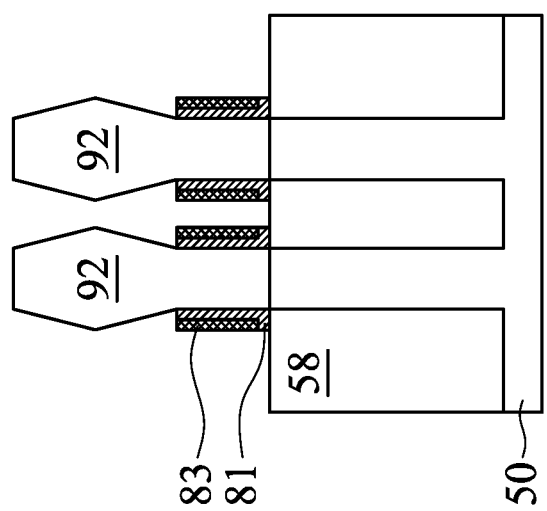

In FIGS. 10A-10C, epitaxial source/drain regions 92 are formed in the first recesses 86 to exert stress on the channel regions 68 of the fins 55, thereby improving performance. As illustrated in FIG. 10B, the epitaxial source/drain regions 92 are formed in the first recesses 86 such that each dummy gate 72 is disposed between respective neighboring pairs of the epitaxial source/drain regions 92. In some embodiments, the first spacers 81 are used to separate the epitaxial source/drain regions 92 from the dummy gates 72 by an appropriate lateral distance so that the epitaxial source/drain regions 92 do not short out subsequently formed gates of the resulting FinFETs.

The epitaxial source/drain regions 92 in the region 50N, e.g., the NMOS region, may be formed by masking the region 50P, e.g., the PMOS region. Then, the epitaxial source/drain regions 92 are epitaxially grown in the first recesses 86. The epitaxial source/drain regions 92 may include any acceptable material, such as appropriate for n-type FinFETs. For example, if the fins 55 are silicon, the epitaxial source/drain regions 92 may include materials exerting a tensile strain on the fins 55, such as silicon, silicon carbide, phosphorous doped silicon carbide, silicon phosphide, or the like. The epitaxial source/drain regions 92 may have surfaces raised from respective surfaces of the fins 55 and may have facets.

The epitaxial source/drain regions 92 in the region 50P, e.g., the PMOS region, may be formed by masking the region 50N, e.g., the NMOS region. Then, the epitaxial source/drain regions 92 are epitaxially grown in the first recesses 86. The epitaxial source/drain regions 92 may include any acceptable material, such as appropriate for p-type FinETs. For example, if the fins 55 are silicon, the epitaxial source/drain regions 92 may comprise materials exerting a compressive strain on the fins 55, such as silicon-germanium, boron doped silicon-germanium, germanium, germanium tin, or the like. The epitaxial source/drain regions 92 may also have surfaces raised from respective surfaces of the fins 55 and may have facets.

The epitaxial source/drain regions 92, the fins 55, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the region 50N and the region 50P, upper surfaces of the epitaxial source/drain regions 92 have facets which expand laterally outward beyond sidewalls of the fins 55. In some embodiments, these facets cause adjacent epitaxial source/drain regions 92 of a same FinFET to merge as illustrated by FIG. 10A. In some embodiments, adjacent epitaxial source/drain regions 92 remain separated after the epitaxy process is completed as illustrated by FIG. 10C. In the embodiments illustrated in FIGS. 10A and 10C, the first spacers 81 may be formed covering portions of the sidewalls of the fins 55 that extend above the STI regions 58 thereby blocking the epitaxial growth. In some embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and/or may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 11B:
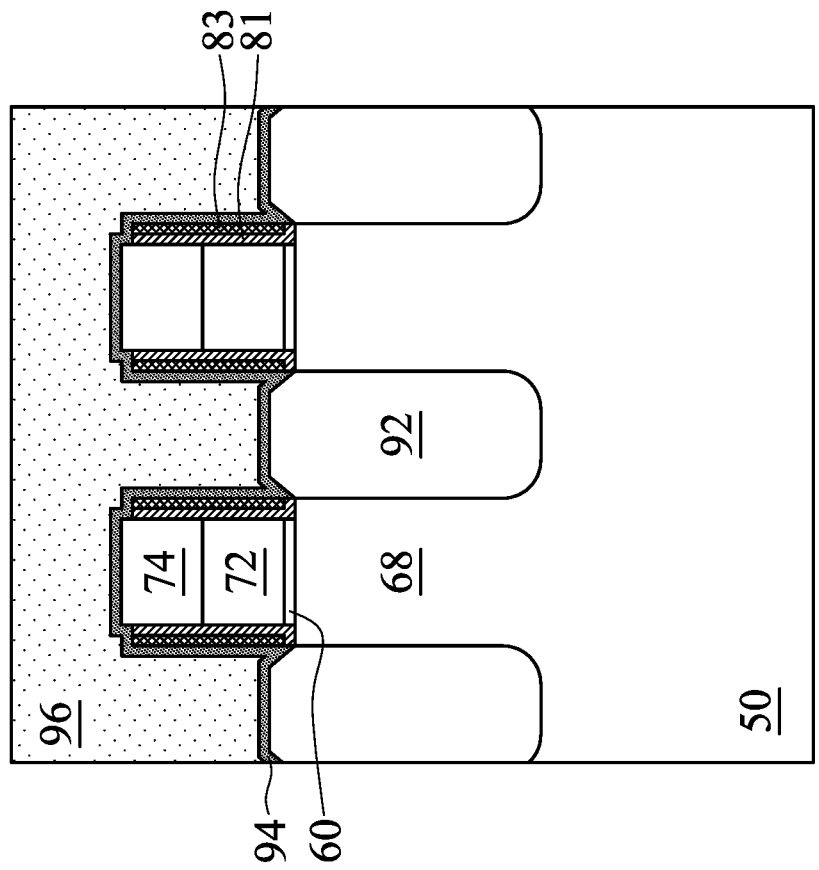
Figure 11A:
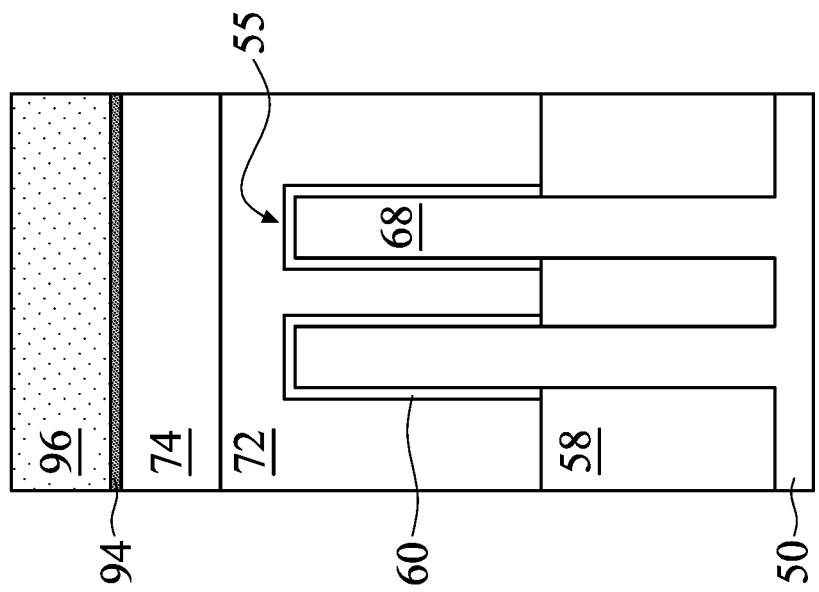

In FIGS. 11A and 11B, a first interlayer dielectric (ILD) 96 is deposited over the structure illustrated in FIGS. 6A and 10B (the processes of FIGS. 7A-10C do not alter the cross-section illustrated in FIGS. 6A, which illustrates the dummy gates 72 and the fins 55 protected by the dummy gates 72), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

In FIGS. 12A and 12B, a planarization process, such as a CMP, may be performed to level the top surface of the first ILD 96 with the top surfaces of the dummy gates 72 or the masks 74. The planarization process may also remove the masks 74 on the dummy gates 72, and portions of the first spacers 81 along sidewalls of the masks 74. After the planarization process, top surfaces of the dummy gates 72, the first spacers 81, and the first ILD 96 are level. Accordingly, the top surfaces of the dummy gates 72 are exposed through the first ILD 96. In some embodiments, the masks 74 may remain, in which case the planarization process levels the top surface of the first ILD 96 with top surface of the masks 74 and the first spacers 81.

Figure 13B:
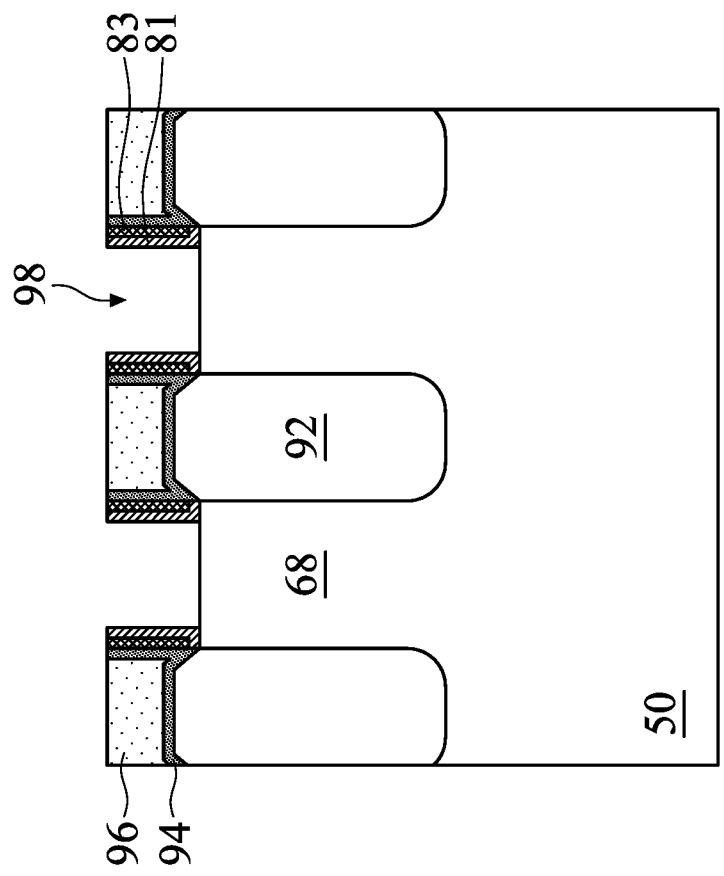
Figure 13A:
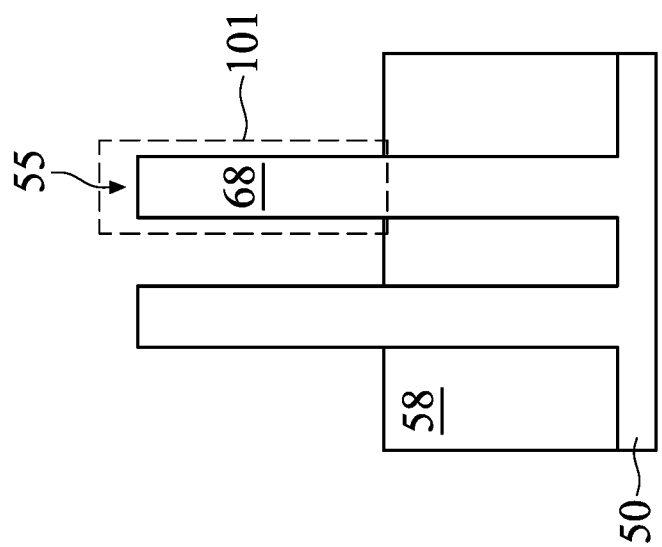

In FIGS. 13A and 13B, the dummy gates 72, and the masks 74 if present, are removed in an etching step(s), so that second recesses 98 are formed. Portions of the dummy dielectric layers 60 in the second recesses 98 may also be removed. In some embodiments, only the dummy gates 72 are removed and the dummy dielectric layers 60 remain and are exposed by the second recesses 98. In some embodiments, the dummy dielectric layers 60 are removed from second recesses 98 in a first region of a die (e.g., a core logic region) and remain in second recesses 98 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies a channel region 68 of a respective fin 55. Each channel region 68 is disposed between neighboring pairs of the epitaxial source/drain regions 92. During the removal, the dummy dielectric layer 60 may be used as an etch stop layer when the dummy gates 72 are etched. The dummy dielectric layer 60 may then be optionally removed after the removal of the dummy gates 72.

FIGS. 14A-18B illustrate various steps used to form gate dielectric layers 100 and gate electrodes 102 for replacement gates. The gate electrodes 102 and the gate dielectric layers 100 may be collectively referred to as "gate stacks." FIGS. 14A-18B illustrate a detailed view of region 101 of FIG. 13A. FIGS. 14A, 15A, 16A, 17A, and 18A illustrate features in the region 50N and FIGS. 14B, 15B, 16B, 17B, and 18B illustrate features in the region 50P. The gate dielectric layers wo may include one or more sub-layers, such as interfacial layers 100A and first dielectric layers 100B. The gate electrodes 102 may also include one or more sub-layers, such as capping layers 102A, p-type work function metal layers 102B, first tuning layers 102C, n-type work function metal layers 102D, second tuning layers 102E, barrier layers 102F, and a fill material 102G.

Figure 14B:
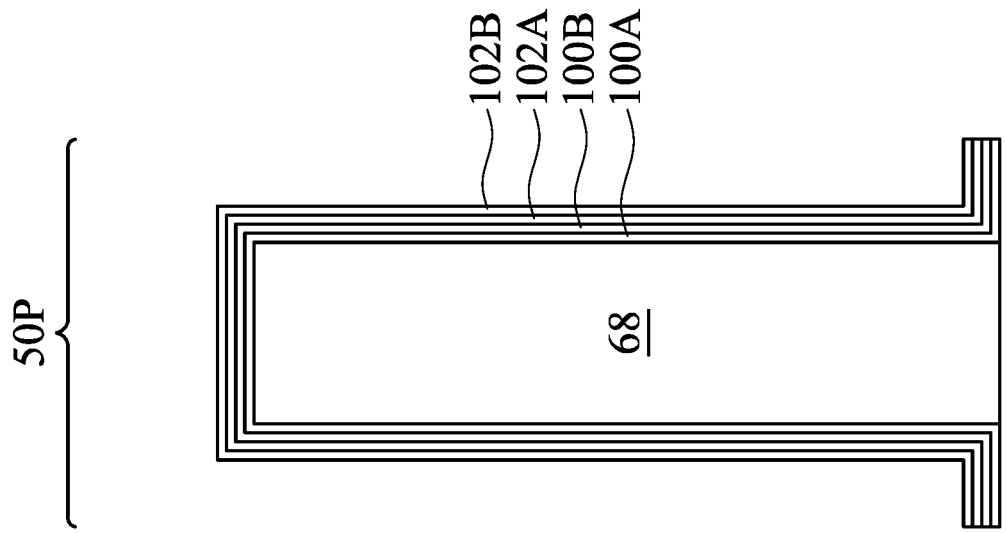
Figure 14A:
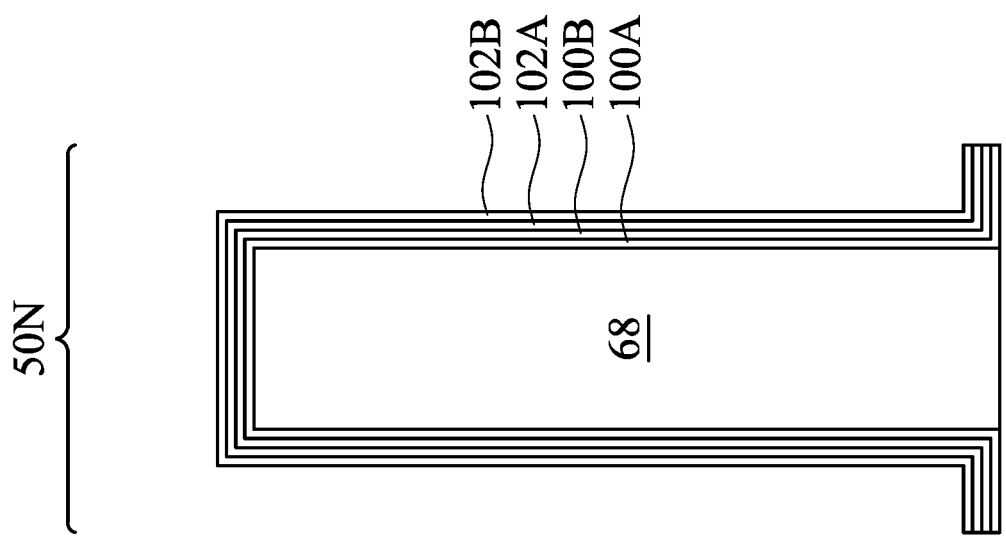

In FIGS. 14A and 14B, interfacial layers 100A, first dielectric layers 100B, capping layers 102A, and p-type work function metal layers 102B are formed. The interfacial layers 100A may be formed or deposited conformally in the second recesses 98, such as on top surfaces of the STI regions 58 and on top surfaces and sidewalls of the fins 55. The interfacial layers 100A may include dielectric materials such as silicon oxide ($SiO_2$), silicon oxynitride (SiON), or the like. The interfacial layers 100A may be formed by chemical oxidation, thermal oxidation, atomic layer deposition (ALD), CVD, or the like. The interfacial layers 100A may have thicknesses from about 10 Å to about 15 Å.

The first dielectric layers 100B may be deposited over the interfacial layer 100A using conformal processes. The first dielectric layers 100B may be high-dielectric constant (high-k) materials such as hafnium oxide ($HfO_2$), aluminum oxide ($Al_2O_3$), lanthanide oxide ($LaO_2$), titanium oxide ($TiO_2$), hafnium zirconium oxide ($HfZrO_2$), tantalum oxide ($Ta_2O_3$), hafnium silicon oxide ($HfSiO_4$), zirconium oxide ($ZrO_2$), zirconium silicon oxide ($ZrSiO_2$), combinations thereof or multiple layers thereof, or the like. The first dielectric layers 100B may be formed by ALD, CVD, or the like. In some embodiments, the interfacial layers 100A may be omitted and the first dielectric layers 100B may be deposited directly on the fins 55. The first dielectric layers 100B may have thicknesses from about 10 Å to about 20 Å or from about 13 Å to about 17 Å.

The formation of the interfacial layers 100A and the first dielectric layers 100B in the region 50N and the region 50P may occur simultaneously such that the gate dielectric layers 100 in each region are formed from the same materials. In some embodiments, the gate dielectric layers 100 in each region may be formed by distinct processes, such that the gate dielectric layers 100 may be different materials. Various masking steps may be used to mask and expose appropriate regions when using distinct processes.

After the first dielectric layers 100B are formed, the capping layers 102A are formed on the first dielectric layers 100B. The capping layers 102A may function as barrier layers to prevent subsequently deposited metal-containing materials from diffusing into the gate dielectric layers 100. Suitable examples of materials which may be used for the capping layers 102A include TiN, TiSiN, combinations or multiple layers thereof, or the like. The capping layers 102A may be formed by ALD, CVD, or the like. The capping layers 102A may have thicknesses from about 5 Å to about 20 Å or from about 10 Å to about 15 Å. The capping layers 102A may be optional and may be omitted in some embodiments.

The p-type work function metal layers 102B are then formed on the capping layers 102A. The p-type work function metal layers 102B are formed for tuning the work function of the device. The p-type work function metal layers 102B may be p-type work function materials for p-type FinFET devices. Suitable examples of the p-type work function materials include transition metal nitrides such as titanium nitride (TiN) or tantalum nitride (TaN), other suitable p-type work function metal materials, multiple layers or combinations thereof, or the like. The p-type work function metal layers 102B may be formed by ALD, CVD, or the like. The p-type work function metal layers 102B may have thicknesses from about 5 Å to about 40 Å or from about 20 Å to about 25 Å.

Figure 15B:
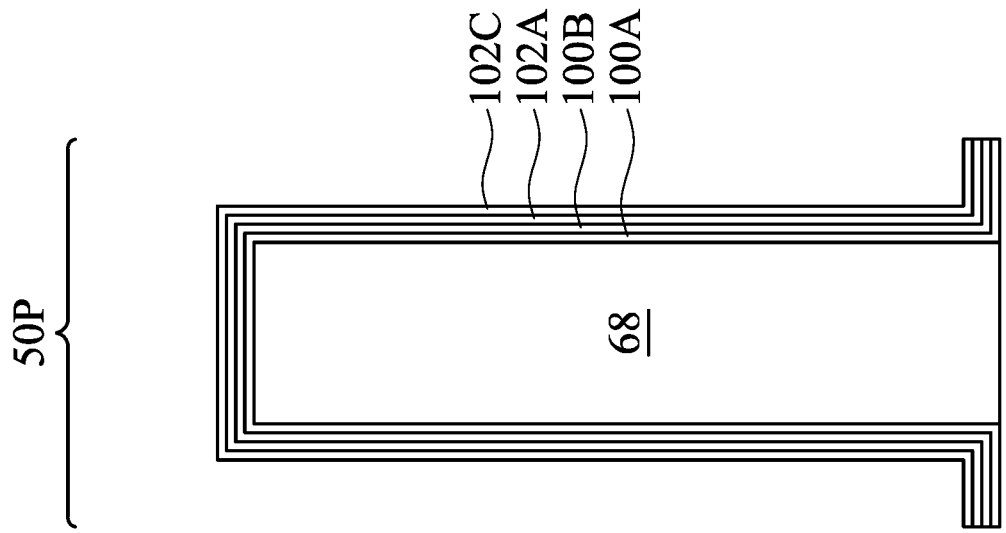
Figure 15A:
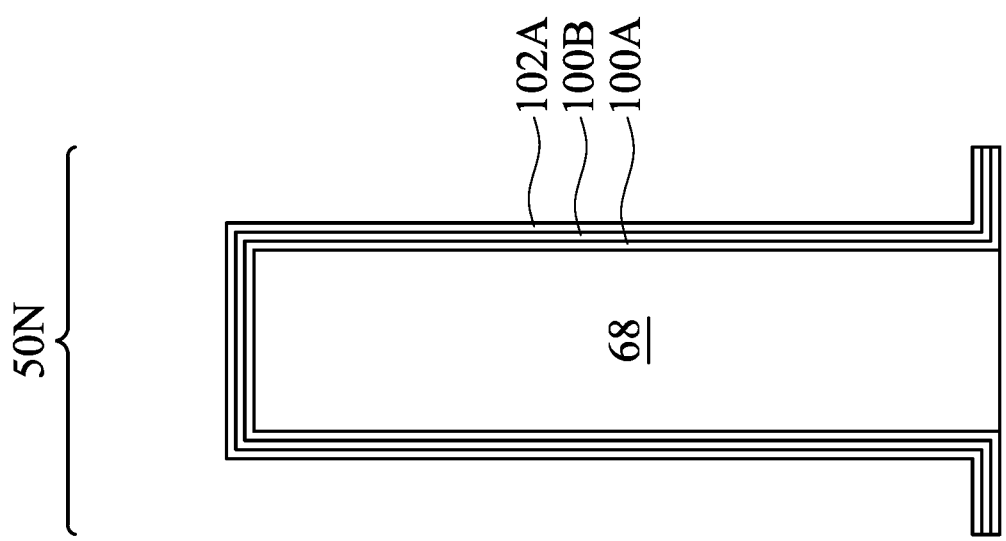

In FIGS. 15A and 15B, the p-type work function metal layer 102B in the region 50P is doped to form a first tuning layer 102C and the p-type work function metal layer 102B is etched from the region 50N. In some embodiments, the p-type work function metal layers 102B in both the region 50N and the region 50P may be doped before etching the p-type work function metal layer 102B from the region 50N. In some embodiments, the p-type work function metal layer 102B in the region 50P may be doped after removing the p-type work function metal layer 102B from the region 50N. In embodiments in which the p-type work function metal layer 102B in the region 50P is doped after removing the p-type work function metal layer 102B from the region 50N, the capping layer 102A and/or the first dielectric layer 100B in the region 50N may be doped by the processes used to dope the p-type work function metal layer 102B in the region 50P. The dopants may be doped throughout the entire thickness of the first tuning layer 102C. An atomic weight percentage of dopants in the first tuning layer 102C may range from about 0.5% to about 30% or from about 10% to about 20%. In some embodiments, the first tuning layer 102C in the region 50P may be doped to a dopant concentration from about $1\times10^{17}$ atoms/cm$^3$ to about $1\times10^{19}$ atoms/cm$^3$ or from about $1\times10^{18}$ atoms/cm$^3$ to about $1)(10^{19}$ atoms/cm$^3$.

Dopants for the p-type work function metal layer 102B may include lanthanum (La), aluminum (Al), magnesium (Mg), combinations thereof, or the like. Implanting any of lanthanum, aluminum, and magnesium into the p-type work function metal layer 102B increases the effective work function in the region 50P, shifts the flat band voltage ($V_{FB}$) towards p, and reduces threshold voltage ($V_t$) in completed devices. The p-type work function metal layer 102B may be doped by forming a dopant-containing layer (not separately illustrated) over the p-type work function metal layer 102B, then performing a drive-in anneal process to drive the dopants from the dopant-containing layer to the p-type work function metal layer 102B. The dopant-containing layer may be formed by ALD, CVD, or the like. The dopant-containing layer may be formed to a thickness in a range from about 15 Å to about 50 Å or from about 15 Å to about 25 Å. The dopant-containing layer may be formed of lanthanum oxide ($La_2O_3$), aluminum oxide ($Al_2O_3$), magnesium oxide (MgO), or the like. The dopant-containing layer may be deposited over the p-type work function metal layers 102B in a deposition chamber maintained at a pressure from about 1 Torr to about 40 Torr or from about 15 Torr to about 25 Torr and a temperature from about 200° C. to about 400° C. or from about 275° C. to about 325° C.

One or more precursor gases may be flowed over the p-type work function metal layer 102B to form the dopant-containing layer. The precursor gases may include a carrier gas such as argon (Ar) or the like and process gases such as a lanthanum-containing gas (e.g. lanthanum bis(trimethylsilyl)amide ($La(N(Si(CH_3)_3)_2)_3$), tris(cyclopentadienyl)lanthanum(III) ($La(C_5H_5)_3$), or the like), an aluminum-containing gas (e.g. triethylaluminum ($Al_2(C_2H_5)_3$) or the like), a magnesium-containing gas (e.g. bis(ethylcyclopentadienyl)magnesium ($Mg(C_5H_4C_2H_5)_2$) or the like), an oxygen containing gas (e.g., water ($H_2O$), oxygen ($O_2$), ozone ($O_3$), or the like), a combination thereof, or the like. For example, in embodiments in which the dopant-containing layer comprises $La_2O_3$, the precursor gases may comprise lanthanum bis(trimethylsilyl)amide and ozone, which react to form the dopant-containing layer over the p-type work function metal layer 102B. The precursor gases may be flowed at a flowrate from about 500 sccm to about 4,000 sccm or from about 2,000 sccm to about 2,5000 sccm. The dopant-containing layer may be deposited through one or more pulses, which may each be followed by a purge. A deposition time for one of the pulses may be from about 1 millisecond to about 10 seconds or from about 3 seconds to about 7 seconds. The dopant-containing layer may have a thickness from about 1.5 nm to about 4 nm or from about 1.5 nm to about 2.5 nm. A ratio of the thickness of the dopant-containing layer to the thickness of the p-type work function metal layer 102B may be from about 0.3 to about 1.

The drive-in anneal process is then performed to drive dopants from the dopant-containing layer to the p-type work function metal layer 102B. The anneal process may use a spike anneal, a rapid thermal anneal (RTA), a flash anneal, or the like. The anneal process may be performed in the range from about 0.2 seconds to about 600 seconds or from about 25 seconds to about 35 seconds. The anneal process may be performed at a temperature from about 350° C. to about 800° C. or from about 400° C. to about 500° C. The anneal process may be performed for a minimal time in order to avoid driving the dopants into the first dielectric layers 100B or the interfacial layers 100A. Driving the dopants into the interface between the first dielectric layers 100B and the interfacial layer 100A may decrease the effective work function in the region 50P, increasing the flat band voltage and the threshold voltage. As such, the dopants are driven into the p-type work function metal layer 102B using a process time which avoids the dopants being driven into the first dielectric layers 100B and the interfacial layers 100A.

The first tuning layer 102C is then etched from the region 50N. A patterned mask, such as a patterned photoresist, may be formed over the first tuning layer 102C in the region 50P. The patterned photoresist may be formed by depositing a photoresist layer over the first tuning layers 102C in the region 50P and the region 50N using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the patterned photoresist. The first tuning layer 102C is then etched from the region 50N using a suitable etch process, such as an isotropic etch process (e.g., a wet etch process), an anisotropic etch process (e.g., a dry etch process), or the like. The patterned photoresist may then be removed. The first tuning layer 102C may be optional and may be omitted in some embodiments. In embodiments in which the first tuning layer 102C is omitted, the p-type work function metal layer 102B may be etched using processes the same as or similar to the processes used to etch the first tuning layer 102C.

Doping the p-type work function metal layer 102B to form the first tuning layer 102C in the region 50P may increase the effective work function in the region 50P, which reduces flat band voltage ($V_{FB}$) and threshold voltage ($V_t$) in completed devices including the first tuning layer 102C. This increases device speed and improves device performance in completed devices.

Figure 15C:
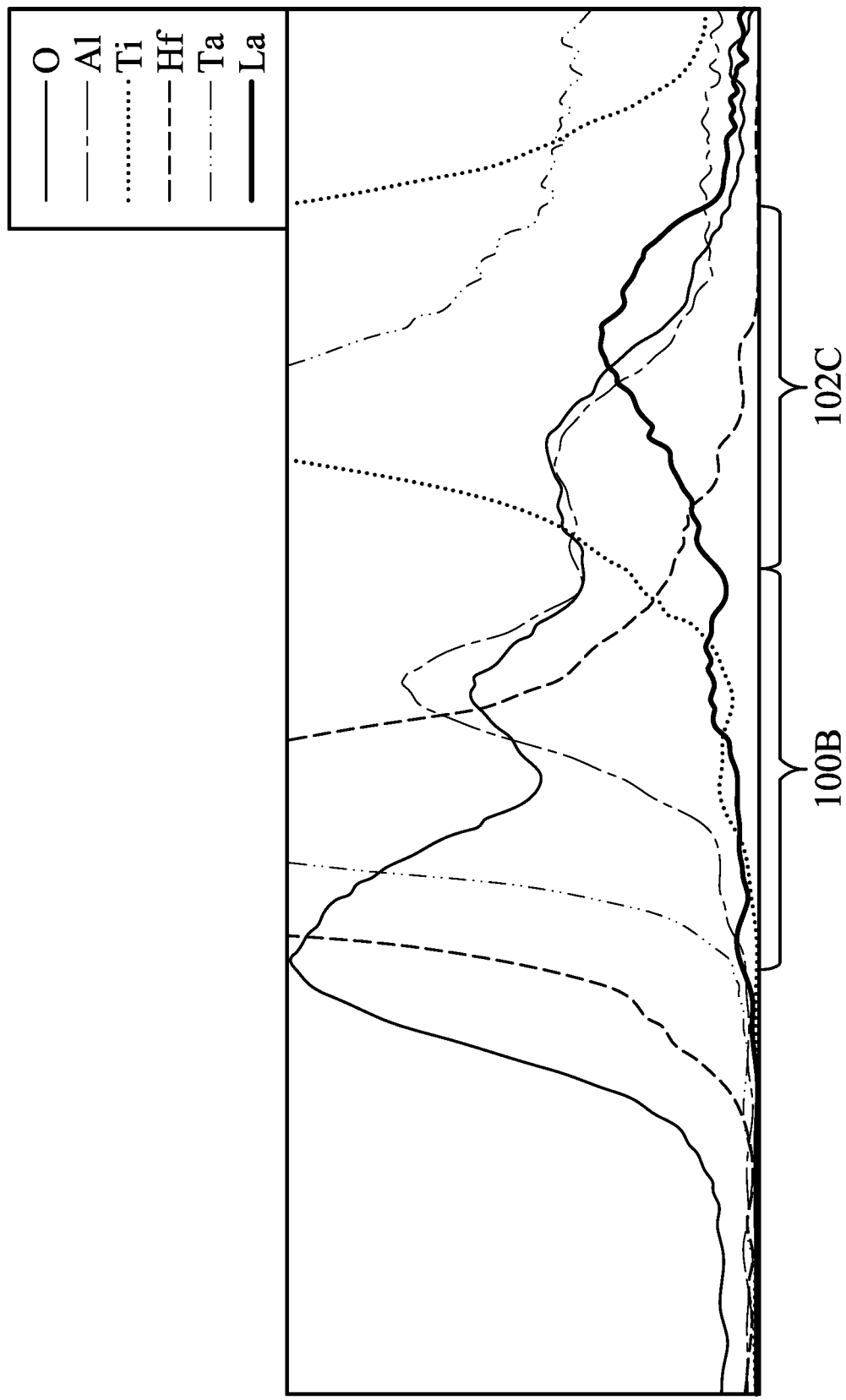
FIGS. 15C and 17C illustrate energy dispersive spectroscopy (EDS) charts of dielectric layers and work function layers in example gate stacks, in accordance with some embodiments.
Figure 16B:
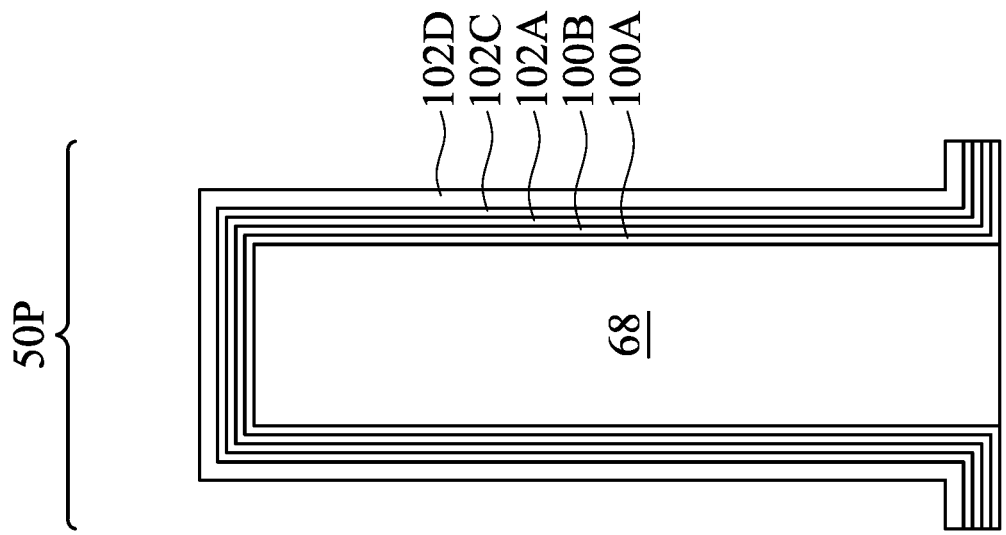
Figure 16A:
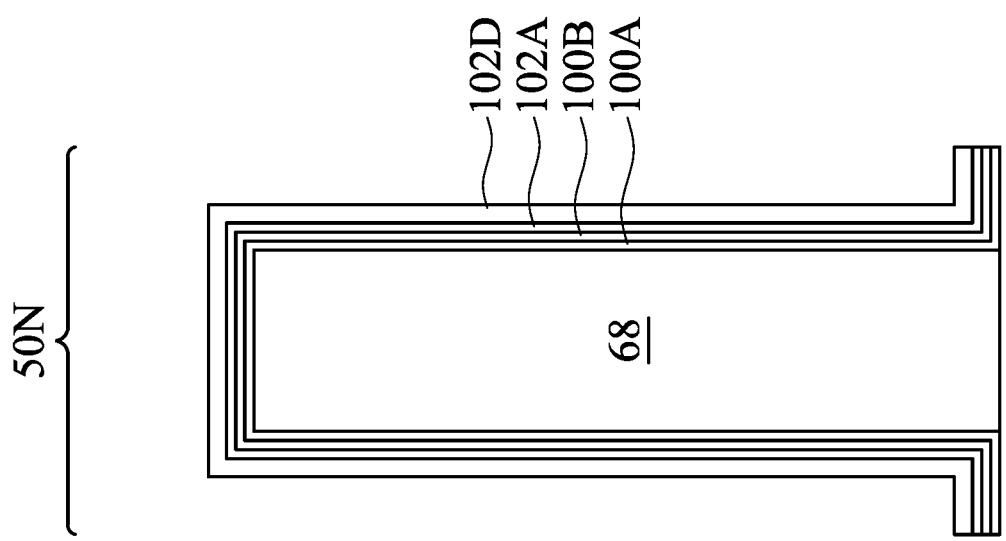

FIG. 15C illustrates an energy dispersive spectroscopy (EDS) chart of the first dielectric layer 100B and the first tuning layer 102C in the region 50P, in accordance with some embodiments. The y-axis provides the relative abundance of elements detected by the EDS, while the x-axis provides the relative position of the elements within the first dielectric layer 100B and the first tuning layer 102C. In the embodiment illustrated in FIG. 15C, the capping layer 102A may be omitted, such that the first tuning layer 102C is formed directly on the first dielectric layer 100B. In the embodiment illustrated in FIG. 15C, the first dielectric layer 100B includes hafnium oxide and the first tuning layer 102C includes lanthanum-doped titanium nitride. The EDS chart shows respective concentrations of oxygen (O), aluminum (Al), titanium (Ti), hafnium (Hf), tantalum (Ta), and lanthanum (La). As shown in this EDS chart, lanthanum was successfully doped throughout the first tuning layer 102C.

As further illustrated in FIG. 15C, a concentration of hafnium in the first dielectric layer 100B may increase from the bottom surface of the first dielectric layer 100B to a maximum at about halfway through the thickness of the first dielectric layer and then decrease to the interface with the first tuning layer 102C. A concentration of oxygen in the first dielectric layer 100B may be at a maximum near the bottom surface of the first dielectric layer 100B. The concentration of oxygen in the first dielectric layer 100B may decrease from the bottom surface of the first dielectric layer 100B to a local minimum at around halfway through the thickness of the dielectric layer 100B, then increase to a local maximum at about three quarters through the thickness of the dielectric layer 100B, and then decrease to the interface with the first tuning layer 102C. A concentration of aluminum in the first dielectric layer 100B may increase from the bottom surface of the first dielectric layer 100B to a maximum at about three quarters through the thickness of the dielectric layer 100B and then decrease to the interface with the first tuning layer 102C. The aluminum may be diffused into the first dielectric layer 100B from the n-type work function metal layer 102D. The first dielectric layer 100B may include relatively low concentrations of titanium and lanthanum, which increase from the bottom surface of the first dielectric layer 100B to the interface with the first tuning layer 102C. Energy peaks for tantalum, hafnium, and tungsten may be overlapping such that the relative concentration of tungsten and hafnium may be misrepresented as the relative concentration of tantalum. As such, although FIG. 15C illustrates a relatively high concentration of tantalum in the first dielectric layer 100B, tantalum concentration may actually represent concentrations of hafnium and tungsten in the first dielectric layer 100B, which may be relatively high.

FIG. 15C also illustrates that concentrations of titanium and lanthanum in the first tuning layer 102C may increase from the interface with the first dielectric layer 100B to maximums at about halfway through the thickness of the first tuning layer 102C, then decrease to the top surface of the first tuning layer 102C. Although FIG. 15C does not illustrate the concentration of nitrogen in the first tuning layer 102C, the first tuning layer includes a relatively high concentration of nitrogen. Concentrations of oxygen and aluminum in the first tuning layer 102C may increase from a local minimum near the interface with the first dielectric layer 100B, to a local maximum near at about halfway through the thickness of the first tuning layer 102C, and then decrease to the top surface of the first tuning layer 102C. The first tuning layer 102C may include a relatively low concentration of hafnium, which decreases from the interface with the first dielectric layer 100B to close to zero. Although FIG. 15C illustrates a relatively high concentration of tantalum in the first tuning layer 102C, the illustrated tantalum concentration may represent relatively high concentrations of hafnium and tungsten in the first tuning layer 102C.

In FIGS. 1.6A and 16B, n-type work function metal layers 102D are formed on the capping layer 102A in the region 50N and the first tuning layer 102C in the region 50P. The n-type work function metal layers 102D are formed for tuning the work function of the devices. The n-type work function metal layers 102D may be n-type work function materials for n-type FinFET devices. Suitable examples of the n-type work function materials include TaAl, TaAlC, HfAl, TiAl, TiAlN, TiAlC, other suitable n-type work function metal materials, multiple layers or combinations thereof, or the like. Including aluminum in the n-type work function materials may decrease the effective work function of the n-type work function metal layers 102D, which reduces threshold voltage, increases device speed, and improves device performance for devices formed in the region 50N. The n-type work function metal layers 102D may be formed by ALD, CVD, or the like. The n-type work function metal layers 102D may have thicknesses from about 10 Å to about 50 Å or from about 25 Å to about 35 Å.

Figure 17B:
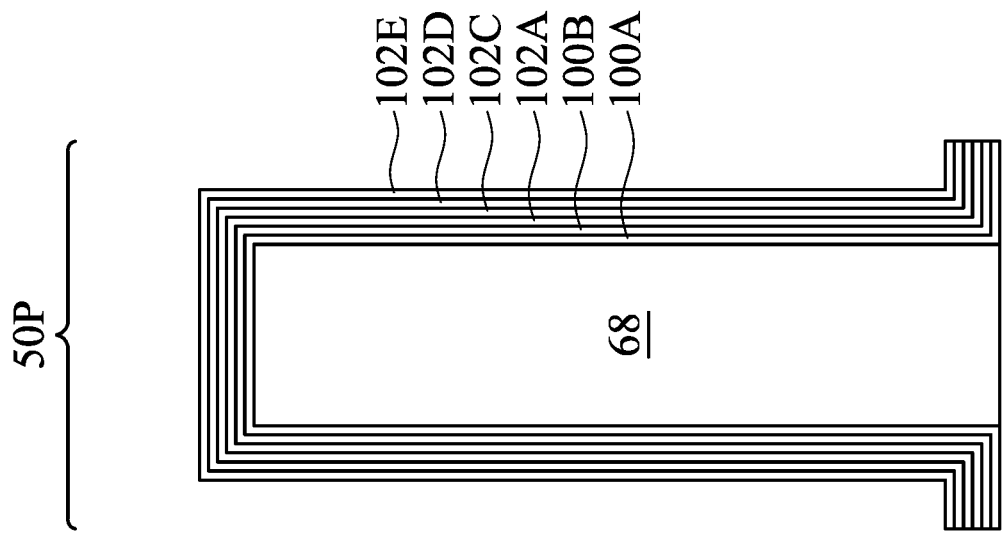
Figure 17A:
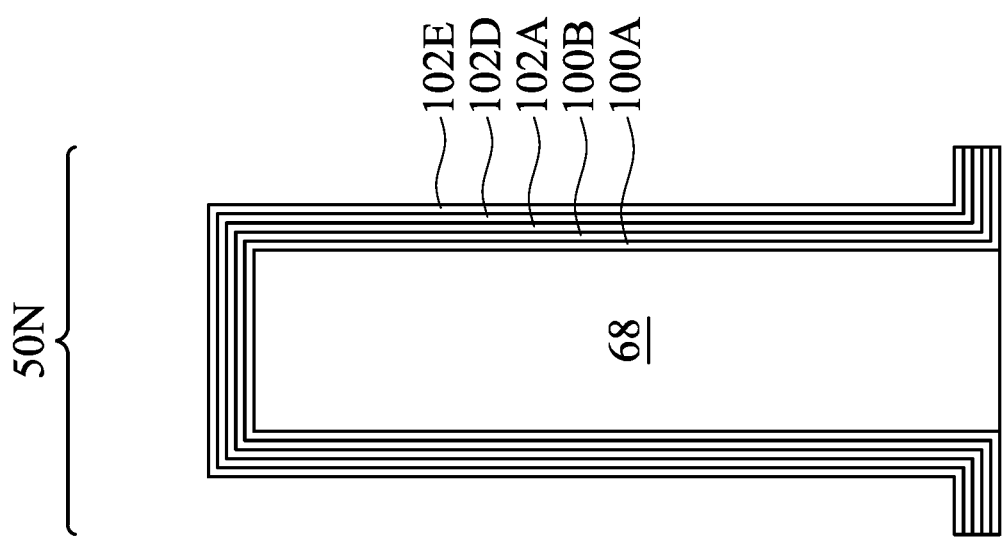

In FIGS. 17A and 17B, the n-type work function metal layers 102D are exposed to a work function tuning gas to thin the n-type work function metal layers 102D and form second tuning layers 102E on the n-type work function metal layers 102D. The work function tuning gas may include a first tuning gas and a second tuning gas. The first tuning gas may be a transition metal chloride or the like. For example, the first tuning gas may include tungsten chloride (e.g., $WCl_5$), tantalum chloride (e.g., $TaCl_5$), hafnium chloride (e.g., $HfCl_4$), titanium chloride (e.g., $TiCl_4$), combinations thereof, or the like. The second tuning gas may be a carrier gas, such as argon (Ar), hydrogen ($H_2$), or the like. The first tuning gas may be supplied at a flowrate from about 100 sccm to about woo sccm or from about 450 sccm to about 550 sccm. The second tuning gas may be supplied at a flowrate from about 1,000 sccm to about 7,000 sccm or from about 2,500 sccm to about 3,5000 sccm. A ratio of the flowrate of the first tuning gas to the second tuning gas may be from about 2 to about 20 or from about 4 to about 8. The work function tuning gas may be supplied in a deposition chamber maintained at a temperature from about 300° C. to about 500° C. or from about 350° C. to about 450° C. and a pressure from about 0.5 Torr to about 50 Torr or from about 15 Torr to about 25 Torr for a period ranging from about 5 seconds to about 600 seconds or from about 25 seconds to about 35 seconds.

Exposing the n-type work function metal layers 102D may thin the n-type work function metal layers 102D, decrease a concentration of an element (e.g., aluminum (Al)) in the n-type work function metal layers 102D, and result in the second tuning layers 102E being deposited over the n-type work function metal layers 102D. When the n-type work function metal layers 102D are exposed to the work function tuning gas, the work function tuning gas reacts with the n-type work function metal layers 102D to form the second tuning layers 102E which may include an alloy of a metal from the n-type work function metal layers 102D and a metal from the work function tuning gas. In some embodiments, the second tuning layer 102E may be an alloy of a transition metal from the work function tuning gas and a metal from the n-type work function metal layers 102D. For example, in embodiments in which the n-type work function metal layers 102D comprise TiAl and the work function tuning gas comprises $WCl_5$, the $WCl_5$ gas may react with the aluminum of the n-type work function metal layers 102D, thereby forming AlW. Example materials for the second tuning layer 102E include aluminum tungsten (AlW), aluminum tantalum (AlTa), aluminum hafnium (AlHf), aluminum titanium (AlTi), or the like.

In some embodiments, an element such as chlorine may be included in the first tuning gas to etch an oxide layer, which may be present in the n-type work function metal layer 102D. For example, an oxide layer including titanium oxide, tantalum oxide, hafnium oxide, or the like may be formed at top surfaces of the n-type work function metal layer 102D and chlorine from the first tuning gas may etch the oxide layer. The first tuning gas further includes a transition metal (e.g., tungsten, tantalum, hafnium, titanium, or the like), which is bonded to an element such as aluminum included in the n-type work function metal layer 102D and which forms the second tuning layer 102E. The amount of aluminum in the n-type work function metal layer 102D is thereby decreased and aluminum bonded to the transition metal in the second tuning layer 102E is prevented from diffusing toward the interface between the capping layer 102A and the first dielectric layer 100B. This allows for the effective work function to be adjusted.

Prior to exposure to the work function tuning gas, the n-type work function metal layers 102D may have an atomic weight percentage of aluminum ranging from about 15% to about 30% or from about 20% to about 25%. Following the exposure to the work function tuning gas, the n-type work function metal layers 102D may have an atomic weight percentage of aluminum ranging from about 5% to about 20% or from about 10% to about 15%. The thickness of the n-type work function metal layers 102D may be reduced to a range from about 15 Å to about 50 Å, a range from about 10 Å to about 35 Å, or a range from about 25 Å to about 35 Å after exposing the n-type work function metal layers 102D to the work function tuning gas. The second tuning layer 102E may have a thickness from about 20 Å to about 25 Å. An atomic weight percentage of aluminum in the second tuning layer 102E may be from about 5% to about 35% or from about 15% to about 25%. The second tuning layers 102E may be optional and may be omitted in some embodiments.

Reducing the aluminum content of the n-type work function metal layers 102D, thinning the n-type work function metal layers 102D, and forming the second tuning layers 102E over the n-type work function metal layers 102D may increase the effective work function in the region 50P. As such, a thinner p-type work function metal layer 102B and/or first tuning layer 102C may be used in the region 50P to obtain the same threshold voltage ($V_t$) as devices that are not exposed to the work function tuning gas. This increases the gap-fill window and flexibility for subsequent layers of the gate electrodes 102, while providing for devices having lower threshold voltages, increased device speed, and improved device performance.

The embodiment discussed above includes the doping process used to form the first tuning layer 102C and the work function tuning process used to thin the n-type work function metal layers 102D and form the second tuning layers 102E. In some embodiments, the doping process only or the work function tuning process only may be performed.

Figure 17C:
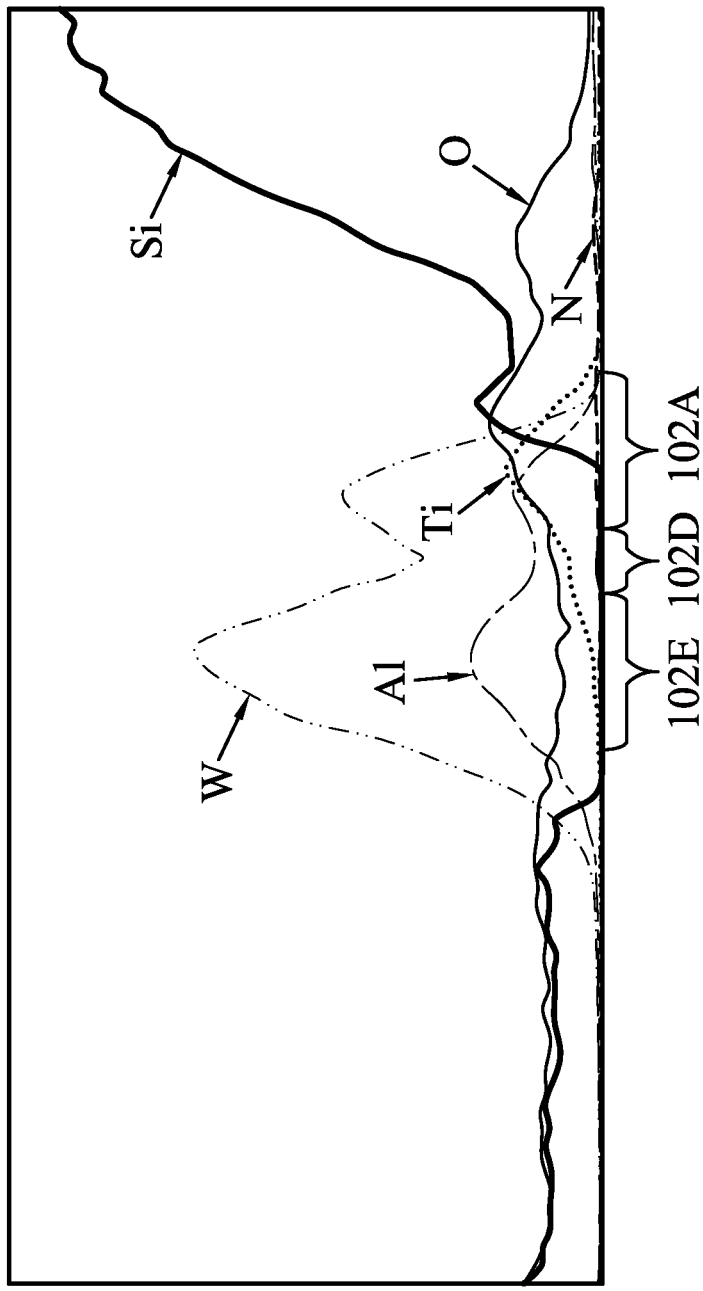

FIG. 17C illustrates an energy dispersive spectroscopy (EDS) chart of the capping layer 102A, the n-type work function metal layer 102D, and the second tuning layer 102E in the region 50N, in accordance with some embodiments. The y-axis provides the relative abundance of elements detected by the EDS, while the x-axis provides the relative position of the elements within the capping layer 102A, the n-type work function metal layer 102D, and the second tuning layer 102E. The EDS chart illustrated in FIG. 17C may be taken in the region 50N such that the n-type work function metal layer 102D is formed directly on the capping layer 102A. In the embodiment illustrated in FIG. 17C, the capping layer 102A includes titanium nitride, the n-type work function metal layer 102D includes titanium aluminum, and the second tuning layer 102E includes aluminum tungsten. The EDS chart shows respective concentrations of tungsten (W), aluminum (Al), titanium (Ti), nitrogen (N), oxygen (O), and silicon (Si). As shown in this EDS chart, the second tuning layer 102E including aluminum tungsten was successfully formed over the n-type work function metal layer 102D including titanium aluminum. The second tuning layer 102E may have the greatest concentration of aluminum and tungsten. The tungsten from the work function tuning gas may penetrate through the n-type work function metal layer 102D and the capping layer 102A.

As illustrated in FIG. 17C, a concentration of titanium in the capping layer 102A may increase from the interface with the first dielectric layer 100B to a maximum at about halfway through the thickness of the capping layer 102A and then decrease to the interface with the n-type work function metal layer 102D. A concentration of aluminum in the capping layer 102A may increase from the interface with the first dielectric layer 100B to a local maximum at about halfway through the thickness of the capping layer 102A and then decrease to the interface with the n-type work function metal layer 102D. A concentration of oxygen in the capping layer 102A may increase from the interface with the first dielectric layer 100B to a maximum at about halfway through the thickness of the capping layer 102A and then decrease to the interface with the n-type work function metal layer 102D. A concentration of tungsten in the capping layer 102A may increase from the interface with the first dielectric layer 100B to a local maximum at about halfway through the thickness of the capping layer 102A and then decrease to the interface with the n-type work function metal layer 102D. A concentration of silicon in the capping layer 102A may increase from the interface with the first dielectric layer 100B to a local maximum at about halfway through the capping layer 102A and then decrease to close to zero. The presence of tungsten in the capping layer 102A may decrease the detection of nitrogen by the EDS. As such, although FIG. 17C illustrates the capping layer 102A as including a relatively low concentration of nitrogen, the actual concentration of nitrogen included in the capping layer 102A may be higher.

In the n-type work function metal layer 102D, a concentration of aluminum may decrease from the interface with the capping layer 102A to a local minimum at about halfway through the thickness of the n-type work function metal layer 102D and then increase to the interface with the second tuning layer 102E. A concentration of titanium in the n-type work function metal layer 102D may decrease from the interface with the capping layer 102A to the interface with the second tuning layer 102E. A concentration of tungsten in the n-type work function metal layer 102D may decrease from the interface with the capping layer 102A to a local minimum at about halfway through the thickness of the n-type work function metal layer 102D and then increase to the interface with the second tuning layer 102E. A concentration of oxygen in the n-type work function metal layer 102D may decrease from the interface with the capping layer 102A to the interface with the second tuning layer 102E. The n-type work function metal layer 102D may include relatively low concentrations of nitrogen and silicon.

In the second tuning layer 102E, concentrations of tungsten and aluminum may increase from the interface with the n-type work function metal layer 102D to maximums at about halfway through the thickness of the second tuning layer 102E, then decrease to the top surface of the second tuning layer 102E. A concentration of oxygen in the second tuning layer 102E may remain relatively constant throughout the thickness of the second tuning layer 102E. A concentration of titanium in the second tuning layer 102E may decrease from the interface with the n-type work function metal layer 102D to the top surface of the second tuning layer 102E. The second tuning layer 102E may include relatively low concentrations of nitrogen and silicon.

Figure 17D:
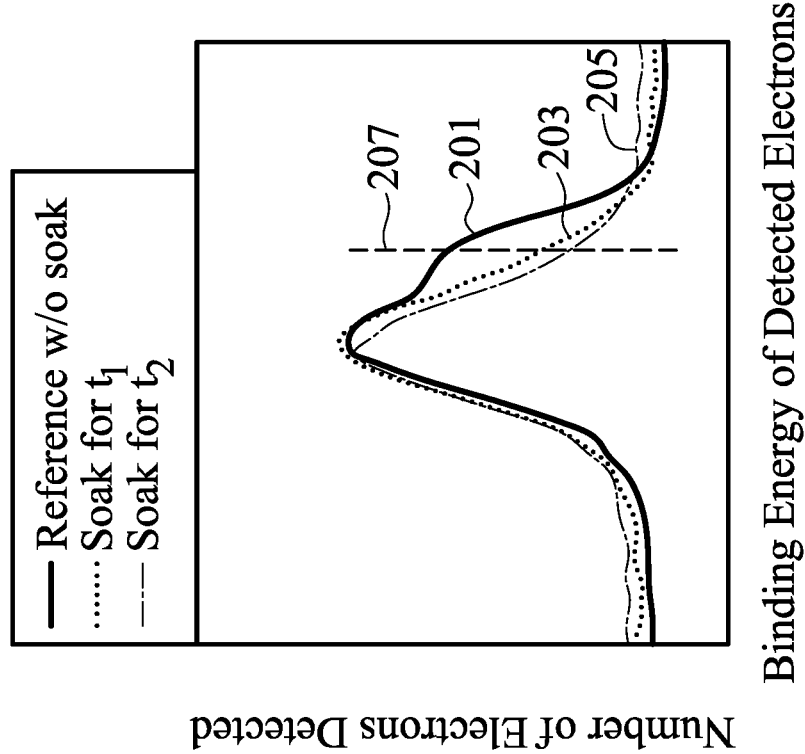
FIG. 17D illustrates an X-ray photoelectron spectroscopy (XPS) chart of an n-type work function metal layer, in accordance with some embodiments.

FIG. 17D illustrates an X-ray photoelectron spectroscopy (XPS) chart of the n-type work function metal layers 102D in an Al2p spectrum for different work function tuning gas exposure times, in accordance with some embodiments. The y-axis provides the relative abundance of electrons detected by the XPS, while the x-axis provides the binding energy of the detected electrons. In an embodiment 201, the n-type work function metal layers 102D are not exposed to the work function tuning gas. In an embodiment 203, the n-type work function metal layers 102D are exposed to the work function tuning gas for a time $t_1$. In an embodiment 205, the n-type work function metal layers 102D are exposed to the work function tuning gas for a time $t_2$. The time $t_1$ may be from about 15 seconds to about 45 seconds or from about 20 seconds to about 40 seconds. The time $t_2$ may be about twice the time $t_1$. For example, the time $t_2$ may be from about 45 seconds to about 75 seconds or from about 50 seconds to about 70 seconds.

In FIG. 17D, the line 207 is provided at a binding energy, which indicates metal-aluminum bonds (e.g., Ti—Al bonds or the like) present in the n-type work function metal layers 102D. In the embodiment 201, the bump near the line 207 indicates a relatively high percentage of metal-aluminum bonds are present in the n-type work function metal layers 102D. In the embodiments 203 and 205, there is no bump near the line 207 and the percentage of metal-aluminum bonds present in the n-type work function metal layers 102D are less in the embodiment 203 than the embodiment 201, and less in the embodiment 205 than the embodiment 203. As such, the percentage of metal-aluminum bonds present in the n-type work function metal layers 102D decreases with increasing exposure time to the work function tuning gas. Decreasing the amount of metal-aluminum bonds present in the n-type work function metal layers 102D may increase the effective work function in the region 50P. As such, a thinner p-type work function metal layer 102B and/or first tuning layer 102C may be used in the region 50P to obtain the same threshold voltage ($V_t$) as devices that are not exposed to the work function tuning gas. This increases the gap-fill window and flexibility for subsequent layers of the gate electrodes 102, while providing for devices having lower threshold voltages, increased device speed, and improved device performance.

Figure 18B:
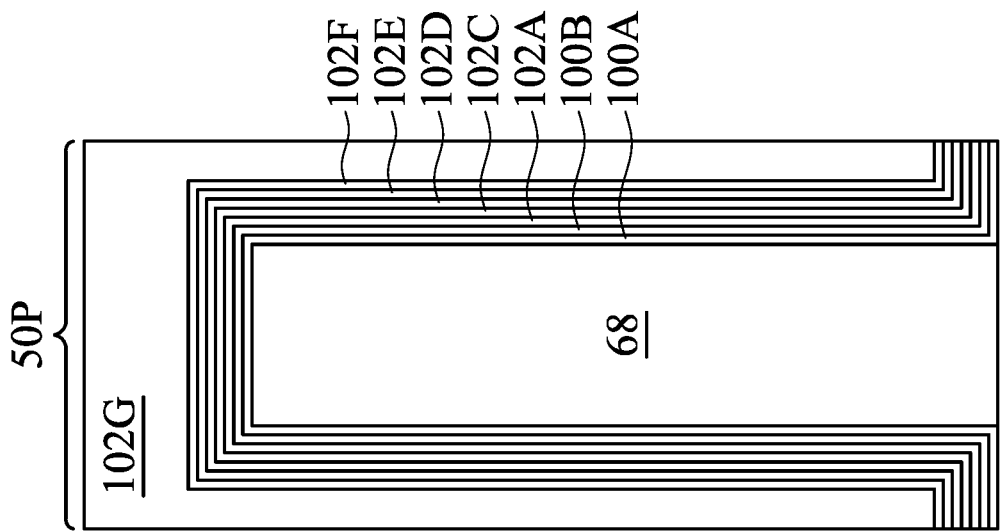
Figure 18A:
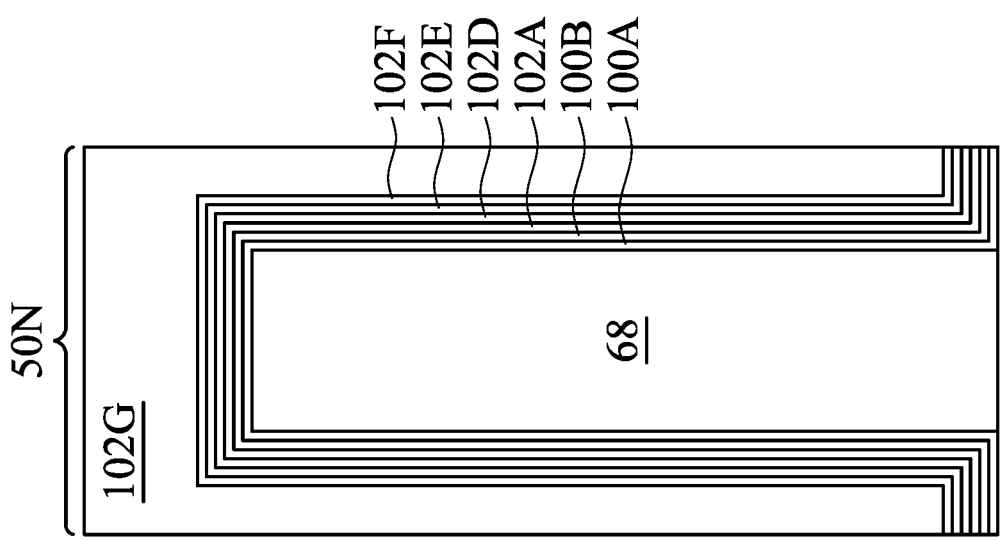

In FIGS. 18A and 18B, barrier layers 102F are formed on the second tuning layers 102E and fill material 102G is formed on the barrier layers 102F. Suitable examples of materials which may be used for the barrier layers 102F include TiN, TiSiN, combinations or multiple layers thereof, or the like. The barrier layers 102F may be formed by ALD, CVD, or the like. The barrier layers 102F may have thicknesses from about 15 Å to about 60 Å or from about 25 Å to about 35 Å. The barrier layers 102F may be optional and may be omitted in some embodiments.

The fill material 102G is then formed on the barrier layers 102F. The fill material 102G may include a metal, such as tungsten (W), aluminum (Al), cobalt (Co), ruthenium (Ru), combinations thereof or the like. The fill material 102G may be deposited by ALD, CVD, or the like. The fill material 102G at least fills the remaining portions of the second recesses 98, e.g., portions of the second recesses 98 not filled by the gate dielectric layers 100 and the capping layers 102A, the first tuning layers 102C, the n-type work function metal layers 102D, the second tuning layers 102E, and the barrier layers 102F. Although the gate electrodes 102 are described as including the capping layers 102A, the first tuning layers 102C, the n-type work function metal layers 102D, the second tuning layers 102E, the barrier layers 102F, and the fill material 102G, any of the layers may be omitted or additional layers may be provided.

Figure 19B:
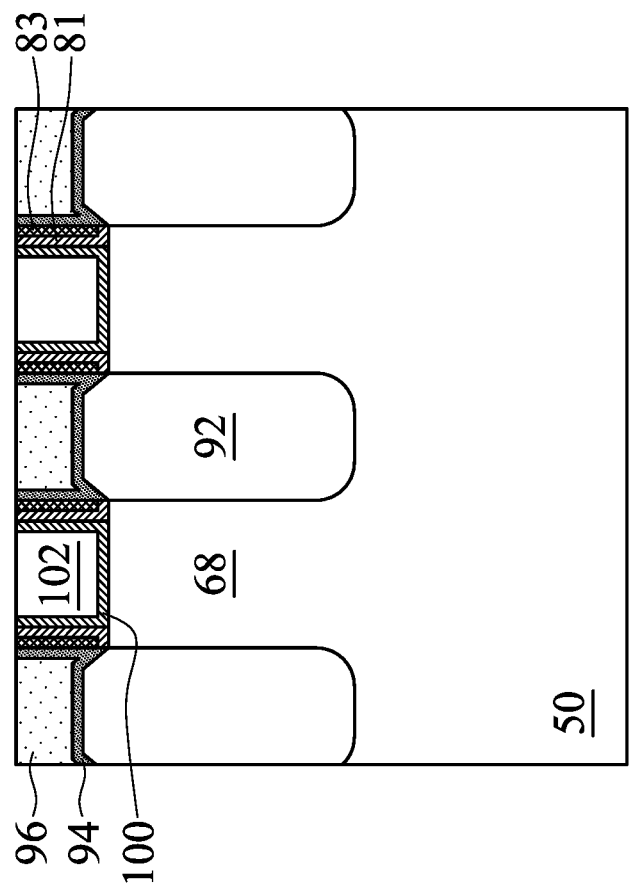
Figure 19A:
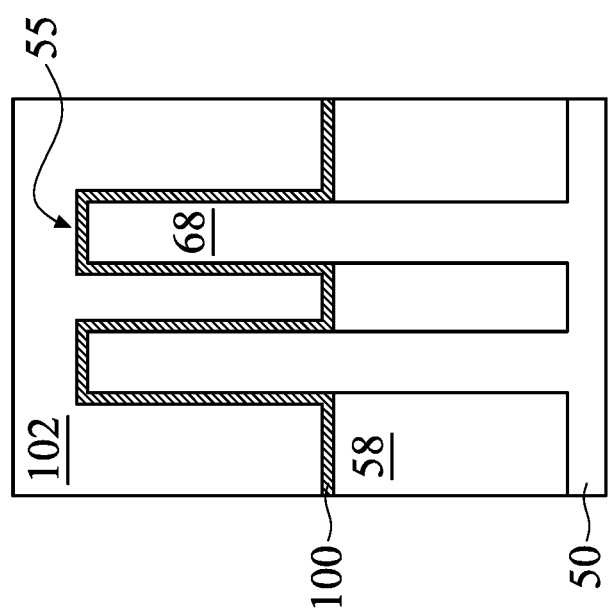

In FIGS. 19A and 19B, the gate electrodes 102 and the gate dielectric layers 100 are planarized. For example, following the formation of the fill material 102G, a planarization process, such as a CMP, may be performed to remove the excess portions of the gate electrodes 102 and the gate dielectric layers 100, which excess portions are over the top surface of the first ILD 96.

In FIGS. 20A and 20B, a second ILD 106 is deposited over the first ILD 96. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like. In some embodiments, before the formation of the second ILD 106, the gate stack (including the gate dielectric layers 100 and the corresponding overlying gate electrodes 102) is recessed, so that a recess is formed directly over the gate stack and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 112, discussed below with respect to FIGS. 21A and 21B) penetrate through the gate mask 104 to contact the top surface of the recessed gate electrodes 102.

Figure 21B:
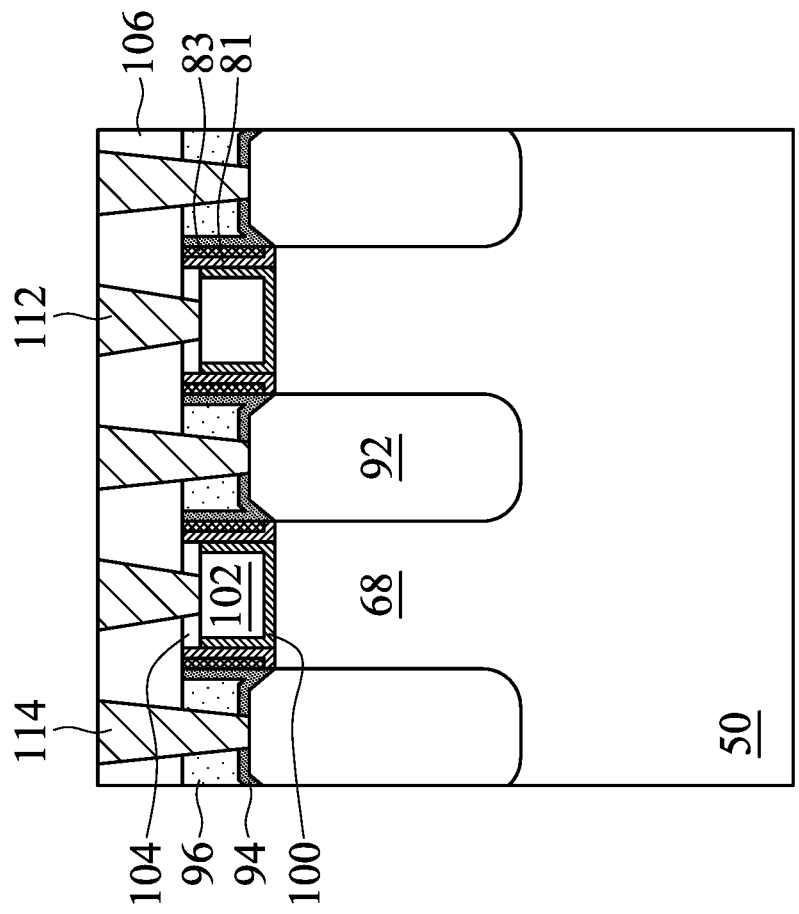
Figure 21A:
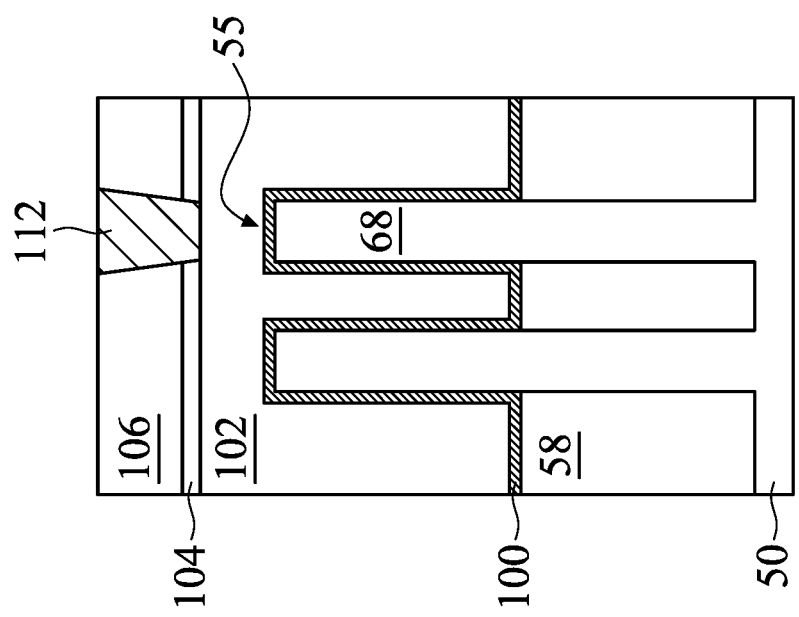

In FIGS. 21A and 21B, gate contacts 112 and source/drain contacts 114 are formed through the second ILD 106 and the first ILD 96. Openings for the source/drain contacts 114 are formed through the first ILD 96 and the second ILD 106 and openings for the gate contacts 112 are formed through the second ILD 106 and the gate mask 104. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner and conductive material form the source/drain contacts 114 and the gate contacts 112 in the openings. An anneal process may be performed to form a silicide at the interface between the epitaxial source/drain regions 92 and the source/drain contacts 114. The source/drain contacts 114 are physically and electrically coupled to the epitaxial source/drain regions 92, and the gate contacts 112 are physically and electrically coupled to the gate electrodes 102. The source/drain contacts 114 and the gate contacts 112 may be formed in different processes, or may be formed in the same process. Although shown as being formed in the same cross-sections, it should be appreciated that each of the source/drain contacts 114 and the gate contacts 112 may be formed in different cross-sections, which may avoid shorting of the contacts.

As discussed previously, semiconductor devices formed according to the above-described methods, which include the first tuning layer 102C, the n-type work function metal layers 102D, and/or the second tuning layers 102E may have reduced threshold voltages ($V_t$), improved device performance, and the like. Specifically, including the above-described first tuning layer 102C may increase the effective work function and decrease the threshold voltage in the region 50P. Including the above-described n-type work function metal layers 102D and the second tuning layers 102E may allow thinner a p-type work function metal layer 102B and/or a first tuning layer 102C to be used, increasing the gap-fill window for subsequent layers of the gate electrodes 102, while also increasing the effective work function and decreasing the threshold voltage in the region 50P.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In accordance with an embodiment, a semiconductor device includes a channel region over a semiconductor substrate; a gate dielectric layer over the channel region; and a gate electrode over the gate dielectric layer, the gate electrode including a first work function metal layer over the gate dielectric layer, the first work function metal layer including aluminum (Al); a first work function tuning layer over the first work function metal layer, the first work function tuning layer including aluminum tungsten (AlW); and a fill material over the first work function tuning layer. In an embodiment, the first work function metal layer includes titanium aluminum (TiAl). In an embodiment, the first work function metal layer has a thickness from 10 Å to 35 Å. In an embodiment, the first work function tuning layer has a thickness from 20 Å to 25 Å. In an embodiment, the gate electrode further includes a second work function metal layer between the gate dielectric layer and the first work function metal layer, and the second work function metal layer includes titanium nitride (TiN). In an embodiment, the second work function metal layer has a thickness from 5 Å to 40 Å. In an embodiment, the second work function metal layer further includes lanthanum (La).

In accordance with another embodiment, a method includes forming a channel region over a semiconductor substrate; depositing a gate dielectric layer over the channel region; depositing an n-type work function metal layer over the gate dielectric layer; and exposing the n-type work function metal layer to a work function tuning gas, the work function tuning gas including a transition metal chloride, a first work function tuning layer being deposited over the n-type work function metal layer. In an embodiment, the transition metal chloride includes tungsten chloride ($WCl_5$). In an embodiment, the transition metal chloride includes hafnium chloride ($HfCl_4$). In an embodiment, an atomic weight percentage of aluminum in the n-type work function metal layer is from 5% to 20% after exposing the n-type work function metal layer to the work function tuning gas. In an embodiment, a ratio of a flowrate of the transition metal chloride to a flowrate of a carrier gas in the work function tuning gas is from 2 to 20. In an embodiment, the method further includes depositing a p-type work function metal layer over the gate dielectric layer; and doping the p-type work function metal layer, the n-type work function metal layer being deposited over the p-type work function metal layer after doping the p-type work function metal layer. In an embodiment, the p-type work function metal layer is doped with lanthanum (La).

In accordance with another embodiment, a semiconductor device includes a fin extending from a semiconductor substrate; an interfacial layer over the fin; a first dielectric layer over the interfacial layer; a p-type work function metal layer over the first dielectric layer, the p-type work function metal layer including a doped transition metal nitride material; and a fill material over the p-type work function metal layer. In an embodiment, the p-type work function metal layer includes lanthanum-doped titanium nitride. In an embodiment, an atomic weight percentage of a dopant in the p-type work function metal layer is from 0.5% to 30%. In an embodiment, the dopant includes aluminum (Al). In an embodiment, the dopant includes magnesium (Mg). In an embodiment, the p-type work function metal layer has a thickness from 5 Å to 40 Å, and a dopant extends throughout the thickness of the p-type work function metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a channel region over a semiconductor substrate;
   depositing a gate dielectric layer over the channel region;
   depositing an n-type work function metal layer over the gate dielectric layer; and
   exposing the n-type work function metal layer to a work function tuning gas, the work function tuning gas comprising a transition metal chloride, wherein a first work function tuning layer is deposited over the n-type work function metal layer.

2. The method of claim 1, wherein the transition metal chloride comprises tungsten chloride ($WCl_5$).

3. The method of claim 1, wherein the transition metal chloride comprises hafnium chloride ($HfCl_4$).

4. The method of claim 1, wherein an atomic weight percentage of aluminum in the n-type work function metal layer is from 5% to 20% after exposing the n-type work function metal layer to the work function tuning gas.

5. The method of claim 1, wherein a ratio of a flowrate of the transition metal chloride to a flowrate of a carrier gas in the work function tuning gas is from 2 to 20.

6. The method of claim 1, further comprising:
   depositing a p-type work function metal layer over the gate dielectric layer; and
   doping the p-type work function metal layer, wherein the n-type work function metal layer is deposited over the p-type work function metal layer after doping the p-type work function metal layer.

7. The method of claim 6, wherein the p-type work function metal layer is doped with lanthanum (La).

8. A method comprising:
   forming a channel region over a semiconductor substrate;
   depositing a gate dielectric layer over the channel region; and
   forming a gate electrode over the gate dielectric layer, by:
     depositing a capping layer over the channel region,
     depositing a first work function metal layer over the capping layer, the first work function metal layer comprising aluminum (Al);
     exposing the first work function metal layer to a work function tuning gas to form a work function tuning layer on the first work function metal layer, wherein the concentration of aluminum in the first work function metal layer decreases from an interface between the first work function tuning layer and the capping layer to about halfway through the thickness of the first work function metal layer, and then increases to an interface between the first work function metal layer to the first work function tuning layer; and
     depositing a fill material over the first work function tuning layer.

9. The method of claim 8, wherein the step of exposing the first work function metal layer to a work function tuning gas includes exposing the first work function metal layer to a metal chloride gas.

10. The method of claim 8, wherein the step of exposing the first work function metal layer to a work function tuning gas thins a thickness of the first work function metal layer.

11. The method of claim 8, wherein the first work function metal layer has a first atomic weight percentage of Al range before the step of exposing the first work function metal layer to a work function tuning gas, and has a second atomic weight percentage of Al range after the step of exposing the first work function metal layer to a work function tuning gas, the second atomic weight percentage being lower than the first atomic weight percentage.

12. The method of claim 8, further comprising depositing a barrier layer on the first work function tuning layer prior to the step of depositing a fill material over the first work function tuning layer.

13. The method of claim 8, wherein the step of exposing the first work function metal layer to a work function tuning gas, forms an alloy of a metal from the first work function metal layer and a metal from the work function tuning gas.

14. A method comprising:
   forming an n-type channel region over a semiconductor substrate;
   forming a p-type channel region over the semiconductor substrate;
   depositing a first gate dielectric layer over the n-type channel region;
   depositing a second gate dielectric layer over the p-type channel region;
   depositing an n-type work function metal layer over the first gate dielectric layer;
   exposing the n-type work function metal layer to a work function tuning gas, the work function tuning gas comprising a transition metal chloride to form a first work function tuning layer is deposited over the n-type work function metal layer;
   forming a p-type work function metal layer over the second gate dielectric layer; and
   forming a p-type work function tuning layer by layer by forming a dopant containing layer on the p-type work function metal layer and driving dopants from the dopant containing layer into the p-type work function metal layer.

15. The method of claim 14, further comprising:
   forming the p-type work function tuning layer over the first gate dielectric layer simultaneously with forming the p-type work function tuning layer over the second gate dielectric layer; and
   removing the p-type work function tuning layer from the first gate dielectric layer.

16. The method of claim 14, further comprising depositing the n-type work function metal layer over the second gate dielectric layer.

17. The method of claim 14, wherein the step of driving dopants from the dopant containing layer into the p-type work function metal layer comprises an anneal process.

18. The method of claim 14 further comprising depositing a capping layer on the first gate dielectric layer prior to the step of depositing an n-type work function metal layer over the first gate dielectric layer.

19. The method of claim 14, wherein the first gate dielectric layer and the second gate dielectric layer both comprises the same material and are formed in a same process.

20. The method of claim 14, wherein the step of forming an n-type channel region over a semiconductor substrate includes forming a fin structure extending from the substrate in which the n-type channel region is formed.

\* \* \* \* \*